(12) United States Patent
Woo et al.

(10) Patent No.: US 7,336,713 B2
(45) Date of Patent: Feb. 26, 2008

(54) METHOD AND APPARATUS FOR ENCODING AND DECODING DATA

(75) Inventors: Sang-oak Woo, Kyungki-do (KR); Seok-yoon Jung, Seoul (KR); Euee-seon Jang, Seoul (KR); Mahn-jin Han, Kyungki-do (KR); Do-kyoon Kim, Kyungki-do (KR); Shin-jun Lee, Seoul (KR); Gyeong-ja Jang, Kyungki-do (KR)

(73) Assignee: Samsung Electronics Co., Ltd., Suwon, Kyungki-Do (KR)

( * ) Notice: Subject to any disclaimer, the term of this patent is extended or adjusted under 35 U.S.C. 154(b) by 892 days.

(21) Appl. No.: 10/305,174

(22) Filed: Nov. 27, 2002

(65) Prior Publication Data

US 2003/0103573 A1     Jun. 5, 2003

Related U.S. Application Data

(60) Provisional application No. 60/369,597, filed on Apr. 4, 2002, provisional application No. 60/342,101, filed on Dec. 26, 2001, provisional application No. 60/334,541, filed on Dec. 3, 2001, provisional application No. 60/333,130, filed on Nov. 27, 2001.

(30) Foreign Application Priority Data

Nov. 2, 2002     (KR)     .................. 10-2002-0067679

(51) Int. Cl.
    *H04B 14/06*     (2006.01)
(52) U.S. Cl. ...................... 375/245; 375/241; 375/242; 375/244; 341/143; 704/212
(58) Field of Classification Search ........ 375/244–252, 375/240.18–25; 341/143; 704/212
    See application file for complete search history.

(56) References Cited

U.S. PATENT DOCUMENTS 4,685,115 A     8/1987     Akagiri et al.

(Continued)

FOREIGN PATENT DOCUMENTS

WO     99/03067     1/1999

(Continued)

OTHER PUBLICATIONS

Kim, James D.K. et al., "Animation Data Compression in MPEG-4:Interpolators," Proceedings 2002 International Conference on Image Processing, ICIP 2002, Sep. 22, 2002, pp. 33-36, vol. 2, New York, NY.

(Continued)

*Primary Examiner*—Curtis B. Odom
(74) *Attorney, Agent, or Firm*—Buchanan Ingersoll & Rooney PC

(57) ABSTRACT

A DPCM operation which can reduce the size of differential data and a method and an apparatus for encoding data using the DPCM operation are provided. A method for generating differential data includes generating differential data by performing a DPCM operation on quantized data and generating predicted differential data by performing a predicted DPCM operation on the quantized data, generating circular-quantized differential data and circular-quantized predicted differential data by performing a circular quantization operation on the differential data and the predicted differential data so as to reduce their ranges, and selecting one of the circular-quantized differential data and the circular-quantized predicted differential data depending on their magnitudes.

9 Claims, 37 Drawing Sheets

U.S. PATENT DOCUMENTS

| | | | |
|---|---|---|---|
| 4,734,768 | A | 3/1988 | Pexa |
| 5,184,316 | A * | 2/1993 | Sugiyama .................. 708/203 |
| 5,422,675 | A * | 6/1995 | Lim ...................... 375/240.24 |
| 5,491,479 | A * | 2/1996 | Wilkinson .................. 341/58 |
| 5,899,970 | A * | 5/1999 | Sonohara .................. 704/229 |
| 2002/0054646 | A1 * | 5/2002 | Tsushima et al. ........... 375/245 |
| 2003/0103572 | A1 | 6/2003 | Lee et al. |
| 2003/0108107 | A1 | 6/2003 | Kim et al. |
| 2003/0128215 | A1 | 7/2003 | Kim et al. |
| 2003/0128884 | A1 | 7/2003 | Lee et al. |
| 2003/0147470 | A1 | 8/2003 | Lee et al. |

FOREIGN PATENT DOCUMENTS

| | | |
|---|---|---|
| WO | 01/41156 | 6/2001 |

OTHER PUBLICATIONS

Lu, Chung H. et al., "A DPCM System with Modulo Limiters," Communications for the Information Age, Proceedings of the Global Telecommunications Conference and Exhibition (Globecom), IEEE, Nov. 28, 1988, pp. 581-585, vol. 1, New York.

Prabhu, K.A., "A Predictor Switching Scheme for DPCM Coding of Video Signals," IEEE Transactions on Communications, Apr. 1985, pp. 373-379, vol. Com-33, No. 4, New York, US.

Partial European Search Report.

Signes, Julien, "Binary Format for Scene (BIFS): Combining MPEG-4 Media to Building Rich Multimedia Services," Proceedings of the SPIE, Jan. 25, 1999, pp. 1506-1517.

Gersho, Allen, "Principles of Quantization," IEEE Transactions on Circuits and Systems, vol. CAS-25, No. 7, Jul. 1978, pp. 427-436.

European Search Report, dated Dec. 29, 2006.

Kim, Do Kyoon, "A Proposal For Interpolator Compression," ISO/IEC JTC1/SC29/WG11, MPEG01/M7473, Jul. 2001, pp. 1-29, Sydney, Australia.

European Search Report, dated Jan. 5, 2007.

* cited by examiner

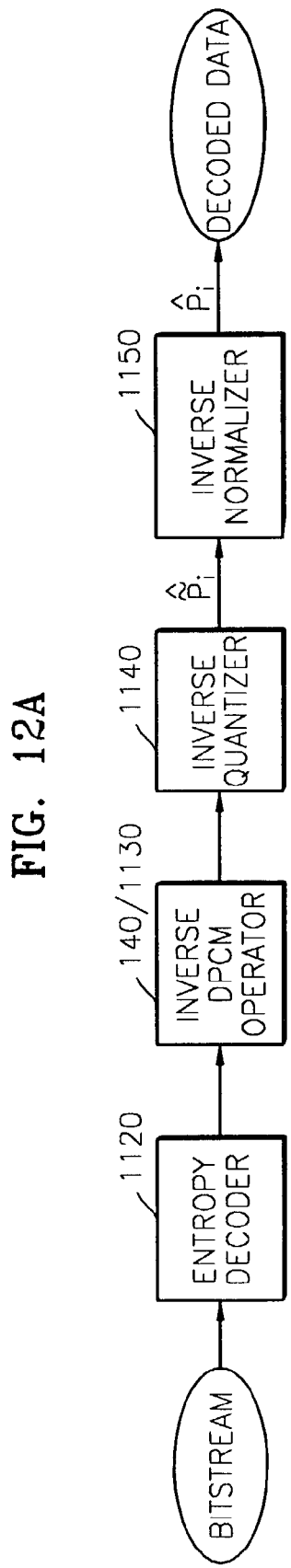

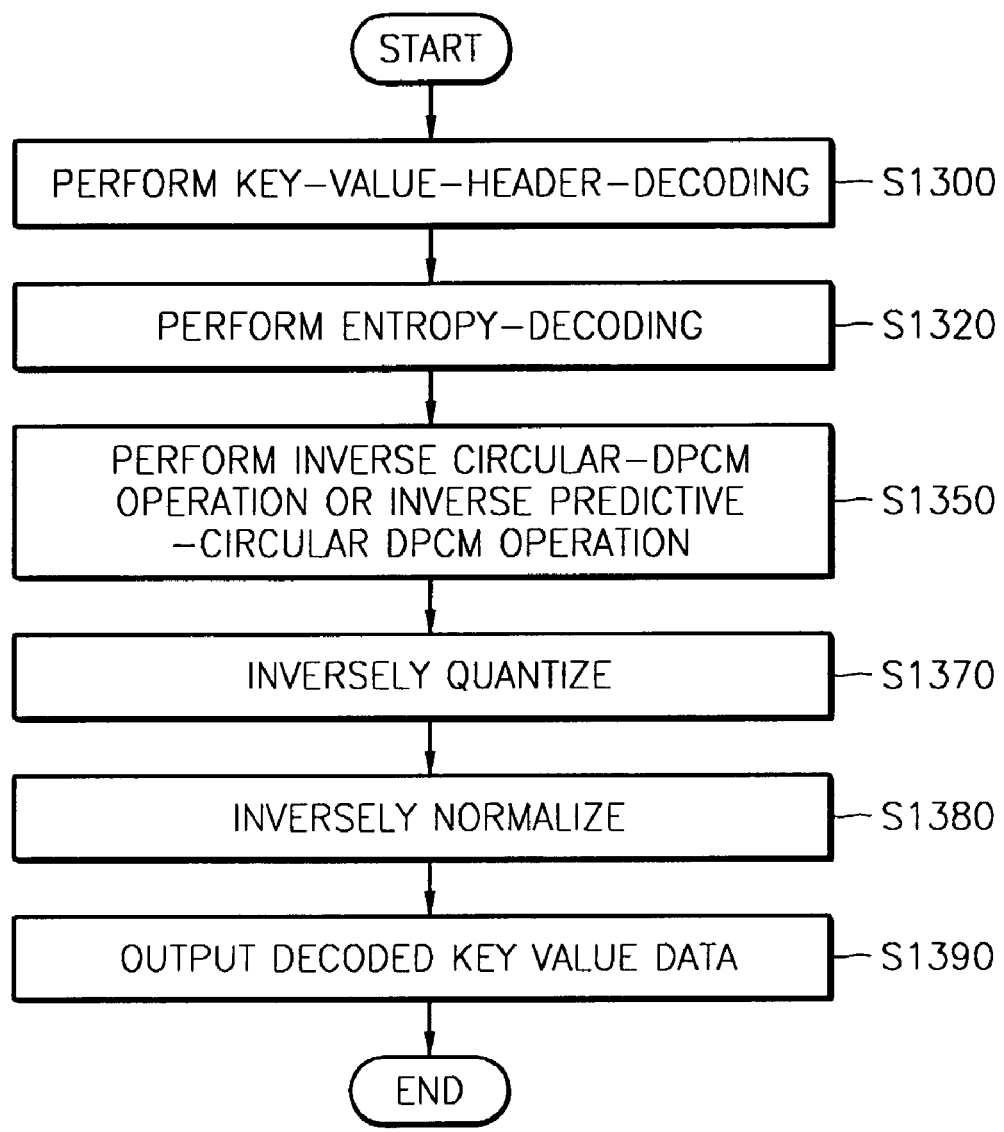

The Output of Quantizer

The Result of DPCM $(2^{nQBits}-2)$ $-(2^{nQBits}-2)$

The Result of Circular DPCM $(2^{nQBits-1}-1)$ $-(2^{nQBits-1}-1)$

FIG. 19

```
class CompressedPositionInterpolator {
        PosIKeyValueHeader posIKVHeader;
        qf_start();
        aligned(8) PosIKeyValue posIKV(posIKVHeader,
posIKVHeader.nNumberOfKeyValue);
}
```

FIG. 20

```
class PosIKeyValueHeader() {
        unsigned int(5) nNumKeyValueCodingBit;
        unsigned int(nNumKeyVaueCodingBit) nNumberOfKeyValue;
        unsigned int(5) nKVQBit;
        bit(1) x_keyvalue_flag;
        bit(1) y_keyvalue_flag;
        bit(1) z_keyvalue_flag;
        unsigned int(4) nKVDigit;
        int nBits = (int)(log10(nKVQBit)/log10(2)) + 1;
if(x_keyvalue_flag == 1) {
                bit(1) nKVDPCMOrder_X;
                bit(1) bIsUnaryAAC_X;
                if(bIsUnaryAAC_X != 1) {
                        unsigned int(nBits) nKVCodingBit_X;
                        unsigned int(1) nStartIndex_X;
                }
        }
        if(y_keyvalue_flag == 1) {
                bit(1) nKVDPCMOrder_Y;
                bit(1) bIsUnaryAAC_Y;
                if(bIsUnaryAAC_Y != 1) {
                        unsigned int(nBits) nKVCodingBit_Y;
                        unsigned int(1) nStartIndex_Y;
                }
        }
        if(z_keyvalue_flag == 1) {
                bit(1) nKVDPCMOrder_Z;
                bit(1) bIsUnaryAAC_Z;
                if(bIsUnaryAAC_Z != 1) {
                        unsigned int(nBits) nKVCodingBit_Z;
                        unsigned int(1) nStartIndex_Z;
                }
        }
        if((nStartIndex_X == 1) && (x_keyvalue_flag == 1))
                        unsigned int(nKVQBit) firstKV_X;
        if((nStartIndex_Y == 1) && (y_keyvalue_flag == 1))
                        unsigned int(nKVQBit) firstKV_Y;
        if((nStartIndex_X == 1) && (z_keyvalue_flag == 1))
                        unsigned int(nKVQBit) firstKV_Z;
        KeyValueMinMax kvMinMax(nKVDigit);
}
```

FIG. 21

```
class KeyValueMinMax(int nKeyValueDigit) {
        bit(1) bUse32Float;
        if(bUse32Float == 0) {
                bit(2) nWhichAxis;
                bit(1) bAllSameMantissaDigitFlag;
                if(bAllSameMantissaDigitFlag == 0) {
                        unsigned int(4) nMantissaDigit_X;
                        unsigned int(4) nMantissaDigit_Y;
                        unsigned int(4) nMantissaDigit_Z;
                } else {
                        bit(1) bSameKVDigitFlag;
                        if(bSameKVDigitFlag == 0)
                                unsigned int(4) nMantissaDigit_X;
                        else
                                nMantissaDigit_X = nKeyValueDigit;
                        nMantissaDigit_Y = nMantissaDigit_X;
                        nMantissaDigit_Z = nMantissaDigit_X;
                }
                bit(1) bMaxDigitFlag;
                if(bMaxDigitFlag == 1)
                        unsigned int(4) nMantissaDigit_M,
                else {
                        switch(nWhichAxis){
                        case 0:
                                nMantissaDigit_M = nMantissaDigit_X;
                                break;
                        case 1:
                                nMantissaDigit_M = nMantissaDigit_Y;
                                break;
                        case 2:
                                nMantissaDigit_M = nMantissaDigit_Z;
                                break;
                        }
                }
                unsigned int(6) nExponentBits;
                nExponentBits = (int)(log10(nExponentBits)/log10(2)) + 1;
                bit(1) bAllSameExponentSign;
                if(bAllSameExponentSign == 1)
                        bit(1) nExponentSign;
                FloatingPointNumber fpnMin_X(nMantissaDigit_X, nExponentBits, bAllSameExponentSign,
nExponentSign);
                FloatingPointNumber fpnMin_Y(nMantissaDigit_Y, nExponentBits, bAllSameExponentSign,
nExponentSign),
                FloatingPointNumber fpnMin_Z(nMantissaDigit_Z, nExponentBits, bAllSameExponentSign,
nExponentSign),
                FloatingPointNumber fpnMax(nMantissaDigit_M, nExponentBits, bAllSameExponentSign,
nExponentSign),
        } else {
                float(32) fMin_X,
                float(32) fMin_Y;
                float(32) fMin_Z,
                float(32) fMax,
        }
}
```

FIG. 22

```
class FloatingPointNumber(unsigned int nDigit, unsigned int nExponentBits,
unsigned int bAllSameExponentSign, int nSameExponentSign) {
    if(nDigit != 0) {
        bit(1) nSign;
        int nBits = (int)(log10(10^nDigit - 1)/log10(2)) + 1;
        unsigned int(nBits) nMantissa;
        unsigned int(nExpoentBits) nExponent;
        if(bAllSameExponentSign == 0)
            bit(1) nExponentSign;
        else
            nExponentSign = nSameExponentSign;
    }
}
```

FIG. 23

```
class PosIKeyValue (PosIKeyValueHeader kVHeader, int nNumberOfKeyValue) {
        if(kVHeader.x_keyvalue_flag == 1) {
                if(kVHeader.bIsUnaryAAC_X == 1)
                        for(i=kVHeader.nStartIndex_X; i<nNumberOfKeyValue; i++)
                                decodeUnaryAAC(&keyValue_X[i], kVXSignContext,
kVXUContext);
                else
                        decodeSQAAC(keyValue_X, kVHeader.nKVCodingBit_X,
kVXSignContext, kVXMaxValueContext, kVXFoundContext, kVXNotFoundContext,
nNumberOfKeyValue, kVHeader.nStartIndex_X);
        }
        if(kVHeader.y_keyvalue_flag == 1) {
                if(kVHeader.bIsUnaryAAC_Y == 1) {
                        for(i= kVHeader.nStartIndex_Y; i<nNumberOfKeyValue; i++)
                                decodeUnaryAAC(&keyValue_Y[i], kVYSignContext,
kVYUContext);
                else
                        decodeSQAAC(keyValue_Y, kVHeader.nKVCodingBit_Y,
kVYSignContext, kVYMaxValueContext, kVYFoundContext, kVYNotFoundContext,
nNumberOfKeyValue, kVHeader.nStartIndex_Y);
        }
        if(kVHeader.z_keyvalue_flag == 1) {
                if(kVHeader.bIsUnaryAAC_Z == 1)
                        for(i= kVHeader.nStartIndex_Z; i<nNumberOfKeyValue; i++)
                                decodeUnaryAAC(&keyValue_Z[i], kVZSignContext,
kVZUContext);
                else
                        decodeSQAAC(keyValue_Z, kVHeader.nKVCodingBit_Z,
kVZSignContext, kVZMaxValueContext, kVZFoundContext, kVZNotFoundContext,
nNumberOfKeyValue, kVHeader.nStartIndex_Z);
        }
}
```

FIG. 24

```
ICDPCM_1stOrder(int* curIDPCMKeyValue, int deltaKeyValue, int prevKeyValue)
{
        int nCircularValue;
        if(deltaKeyValue >= 0)
                nCircularValue = deltaKeyValue  (2^nKeyValueQBits  1);
        else
                nCircularValue = deltaKeyValue + (2^nKeyValueQBits  1);
        *curIDPCMKeyValue = deltaKeyValue + prevKeyValue;
        if(*curIDPCMKeyValue < 0)
                * curIDPCMKeyValue = prevKeyValue + nCircualrValue;
        else if(*curIDPCMKeyValue > (2^nKeyValueQBits  1))
                * curIDPCMKeyValue = prevKeyValue + nCircualrValue;
}
```

FIG. 25

```
        void    decodeUnaryAAC(int*    nDecodedValue,   QState*    signContext,    QState*
valueContext)
        {
                int nBits = -1;
                bit bBit;
                do {
                        qf_decode(&bBit, valueContext);
                        nBits++;
                } while(bBit == 0);
                if(nBits != 0) {
                        qf_decode(&bBit, signContext);
                        if(bBit == 0)
                                * nDecodedValue = nBits;
                        else
                                * nDecodedValue = -nBits;
                }
                else
                        * nDecodedValue = 0;
        }
```

FIG. 26

```
void    decodeUnaryAAC(int*    nDecodedValue,    QState*    signContext,    QState* valueContext)
    {
        int nBits = -1;
        bit bBit;
        do {
            qf_decode(&bBit, valueContext);
            nBits++;
        } while(bBit == 0);
        if(nBits != 0) {
            qf_decode(&bBit, signContext);
            if(bBit == 0)
                * nDecodedValue = nBits;
            else
                * nDecodedValue = -nBits;
        }
        else
            * nDecodedValue = 0;
    }
```

FIG. 27

```
    void decodeSQAAC(int* anDecodedValues, int qstep, QState* signContext, QState*
maxValueContext, QState* foundContext, QState* notFoundContext, int keynum, int start) {
        int range_mid[keynum], range_min[keynum], range_max[keynum], sign[keynum];
        bool found[keynum];
        int max_val = 0;
        int max_count = 1;
        bool all_level_done = false;
        int max_index = -1;
        bit bBit;
        for (int j=qstep; j>=0; j--) {
            qf_decode(&bBit, &maxValueContext);
            max_val = (max_val << 1) + bBit;
        }
        for(int i=start; i<keynum; i++) {
            range_min[i] = 0;
            range_max[i] = max_val;
            found[i] = false;
            qf_decode(&bBit, &signContext);
            if (bBit)
                sign[i] = -1;
            else
                sign[i] = 1;
        }
        while (!all_level_done) {
            all_level_done = true;
            max_index = -1;
            for(i=start; i<keynum; i++) {
                if (range_max[i] != range_min[i]) {
                    all_level_done = false;
                    range_mid[i]    =    (int)((range_max[i] -
range_min[i])/2) + 1 + range_min[i];
                    if (found[i])
                        qf_decode(&bBit, &foundContext);
                    else
                        qf_decode(&bBit, ¬FoundContext);
                    if (bit) {
                        if (max_count == 1 && range_max[i] ==
max_val) {
                            if (max_index == -1)
                                max_index = i;
                            else
                                max_index = keynum;
                        }
                        range_min[i] = range_mid[i];
                        found[i] = true;
                    }
                    else
                        range_max[i] = range_mid[i]-1;
                }
            }
            if (max_index >= 0 && max_index < keynum) {
                range_min[max_index] = max_val;
                max_count = 0;
            }
        }
        for(i=start; i<keynum; i++)
            anDecodedValues[i] = range_max[i] * sign[i];
    }
```

METHOD AND APPARATUS FOR ENCODING AND DECODING DATA

This application claims the priority of Korean Patent Application No. 2002-67679, filed Nov. 2, 2002, in the Korean Intellectual Property Office. This application also claims the benefit of U.S. Provisional Application No. 60/333,130, filed Nov. 27, 2001; U.S. Provisional Application No. 60/334,541, filed Dec. 3, 2001; U.S. Provisional Application No. 60/342,101, filed Dec. 26, 2001; and U.S. Provisional Application No. 60/369,597, filed Apr. 4, 2002. The entire contents of these applications are incorporated herein by reference.

BACKGROUND OF THE INVENTION

1. Field of the Invention

The present invention relates to an apparatus and a method for encoding and decoding data, and more particularly, to a differential pulse code modulation (DPCM) operation, a method of normalizing data, and a method and an apparatus for encoding and decoding data using the DPCM operation and the method of normalizing data.

2. Description of the Related Art

FIG. 1 is a block diagram showing the structures of a conventional apparatus for encoding data and a conventional apparatus for decoding data. Referring to FIG. 1, a conventional apparatus for encoding data includes a quantizer 100, a DPCM operator 110, and an entropy encoder 120. According to a conventional method for encoding data, input data are quantized with a predetermined number of bits in the quantizer 100 and are input into the DPCM operator 110. The DPCM operator 110 generates differential data by subtracting the current quantized data input from the quantizer 100 from previous quantized data and outputs the differential data to the entropy encoder 120. The entropy encoder 120 encodes the differential data into a bitstream using a predetermined entropy-encoding method.

Referring to FIG. 1, a conventional apparatus for decoding data includes an entropy decoder 130, an inverse DPCM operator 140, and an inverse quantizer 150. A bitstream, into which data are encoded, is input into the entropy decoder 130. The entropy decoder 130 outputs differential data inversely performing the process performed by the entropy encoder, and then the inverse DPCM operator 140 converts the differential data input from the entropy decoder 130 into quantized data and outputs the quantized data to the inverse quantizer 150. The inverse quantizer 150 inversely quantizes the quantized data input from the inverse DPCM operator 140 and then outputs decoded data.

However, since the aforementioned conventional method for encoding data only performs a simple DPCM operation so as to reduce the amount of data to be encoded and encodes data having a plurality of components without considering the characteristics of each of the x, y, and z components of the data, especially when the data are consecutively input, its encoding efficiency is not high enough.

SUMMARY OF THE INVENTION

To solve the above and other problems, it is an aspect of the present invention to provide a DPCM operation and a DPCM operator which can considerably reduce the size of data to be encoded.

It is another aspect of the present invention to provide a method and an apparatus for encoding and decoding data, which can minimize a quantization error generated during a quantization process and can encode the sign of data.

It is another aspect of the present invention to provide a method and an apparatus for encoding and decoding data, using a method of normalizing data which can reduce the size of data having a plurality of components by normalizing data of each of the x, y, and z components based on one component.

It is another aspect of the present invention to provide a method and an apparatus for encoding data, in which the DPCM operation, the error minimization method, and the data normalization method according to the present invention are applied to a method for encoding and decoding key value data of a position interpolator for representing the positions of objects appearing in a three-dimensional animation, and a method and an apparatus for decoding a bitstream which has been encoded following the method and apparatus for encoding data.

Accordingly, to achieve the above and other aspects of the present invention, there is provided an apparatus for generating differential data. The apparatus includes a circular DPCM operator which performs a DPCM operation on quantized data so as to generate differential data, performs a circular quantization operation on the differential data so as to reduce their range, and then outputs circular-quantized differential data, a predictive-circular DPCM operator which performs a predictive DPCM operation on the quantized data so as to generate predicted differential data, performs a circular quantization operation on the predicted differential data so as to reduce their range, and then outputs circular-quantized predicted differential data, and a selector which selects one of the circular-quantized differential data and the predicted differential data depending on the value of the differential data input thereinto.

To achieve the above and 'other aspects of the present invention, there is provided a method for generating differential data. The method includes (a) generating differential data by performing a DPCM operation on quantized data and generating predicted differential data by performing a predicted DPCM operation on the quantized data, (b) generating circular-quantized differential data and circular-quantized predicted differential data by performing a circular quantization operation on the differential data and the predicted differential data so as to reduce their range, and (c) selecting one of the circular-quantized differential data and the circular-quantized predicted differential data depending on their magnitudes.

To achieve the above and other aspects of the present invention, there is provided an apparatus for generating quantized data using differential data. The apparatus includes an inverse circular DPCM operator which performs an inverse circular quantization operation on differential data input thereinto so as to extend their range, performs an inverse DPCM operation on the results of the inverse circular quantization operation, and then outputs quantized data, an inverse predictive-circular DPCM operator which performs an inverse circular quantization operation on differential data input thereinto so as to extend their range, performs an inverse predictive DPCM operation on the results of the inverse circular quantization operation, and then outputs quantized data, and a determining unit which outputs differential data to the inverse circular DPCM operator or the inverse predictive-circular DPCM operator depending on the kind of DPCM that has been performed on the differential data. To achieve the above and other aspects of the present invention, there is provided a method for generating quantized data using differential data. The method includes (a) identifying the kind of DPCM that has been performed on input differential data, (b) performing an inverse circular quantization operation on the input differential data so as to extend their range, and (c) generating quantized data by performing an inverse circular DPCM operation on the inversely circular-quantized differential data if a DPCM operation has been performed on the input differential data and performing an inverse predictive-circular DPCM operation on the inversely circular-quantized differential data if a predictive DPCM operation has been performed on the input differential data.

To achieve the above and other aspects of the present invention, there is provided an apparatus for encoding data. The apparatus includes a quantizer which quantizes data input thereinto into predetermined quantization bits, a DPCM operator which generates differential data by performing a DPCM operation on the quantized data, an entropy encoder which entropy-encodes the differential data input from the DPCM operator and outputs the entropy-encoded differential data into a bitstream, a quantization error minimizer which receives the input data and the quantized data, adjusts maximum and minimum values among the input data so as to minimize a quantization error, and outputs the maximum and minimum values, and a header encoder which encodes the maximum and minimum values to be included in the bitstream.

To achieve the above and other aspects of the present invention, there is provided a method for encoding data. The method includes (a) quantizing input data with predetermined quantization bits, (b) generating differential data by performing a DPCM operation on the quantized data, (c) generating a bitstream by entropy-encoding the differential data generated in step (b), (d) adjusting maximum and minimum values among the input data, using the input data and the quantized data, so as to minimize a quantization error, and (e) encoding the maximum and minimum values to be included in the bitstream.

To achieve the above and other aspects of the present invention, there is provided an apparatus for encoding data having a plurality of components. The apparatus includes a normalizer which calculates a maximum range among data ranges of the components and normalizes the data of each of the components based on the maximum range, a quantizer which quantizes the normalized data with predetermined quantization bits, a DPCM operator which performs a DPCM operation on the quantized data and then outputs differential data, and an entropy encoder which entropy-encodes the differential data and outputs a bitstream, into which the differential data are encoded.

To achieve the above and other aspects of the present invention, there is provided a method for encoding data which encodes data having a plurality of components. The method includes (a) calculating a maximum range among data ranges of the components and normalizing the data of each of the components based on the maximum range, (b) quantizing the normalized data with predetermined quantization bits, (c) generating differential data by performing a DPCM operation on the quantized data, and (d) generating a bitstream, into which data are encoded, by entropy-encoding the differential data.

To achieve the above and other aspects of the present invention, there is provided an apparatus for decoding data, which decodes a bitstream into which data having a plurality of components are encoded. The apparatus includes an entropy decoder which entropy-decodes a bitstream input thereinto and outputs differential data, an inverse DPCM operator which performs an inverse DPCM operation on the differential data and outputs quantized data, an inverse quantizer which inversely quantizes the quantized data and outputs normalized data, and an inverse normalizer which receives minimum values among data of each component and a maximum value among the data of each of the components from the bitstream, obtains a maximum range of the normalized data, and inversely normalizes the normalized data based on the maximum range and the minimum values.

To achieve the above and other aspects of the present invention, there is provided a method for decoding data, which decodes a bitstream into which data having a plurality of components are encoded. The method includes (a) generating differential data by entropy-decoding an input bitstream, (b) generating quantized data by performing an inverse DPCM operation on the differential data, (c) generating normalized data by inversely quantizing the quantized data, and (d) obtaining a maximum range of the normalized data using minimum values among data of each component and a maximum value among the data of each of the components, which are decoded from the bitstream, and inversely normalizing the normalized data based on the maximum range and the minimum values.

To achieve the above and other aspects of the present invention, there is provided an apparatus for encoding data which encodes key value data of a position interpolator representing the position of an object with x, y, and z components. The apparatus includes a normalizer which calculates a maximum range among data ranges of components, normalizes the key value data of each of the x, y, and z components based on the maximum range, and outputs normalized key value data, a quantizer which quantizes the normalized key value data with predetermined quantization bits, a floating-point number encoder which receives the minimum values and the maximum range used in a normalization operation and converts the input values into decimal numbers, a DPCM processor which obtains differential data and predicted differential data of the quantized key value data and performs a circular quantization operation on the differential data and the predicted differential data so as to reduce their range, an entropy encoder which entropy-encodes the differential data and then outputs a bitstream, into which the key value data are encoded, and a key value header encoder which encodes information required for decoding the bitstream to be included in the bitstream.

To achieve the above and other aspects of the present invention, there is provided a method for encoding data which encodes key value data of a position interpolator representing the position of an object with x, y, and z components. The method includes (a) calculating a maximum range among data ranges of components, normalizing the key value data of each of the x, y, and z components based on the maximum range, and thus generating normalized key value data, (b) quantizing the normalized key value data with predetermined quantization bits, (c) converting the minimum values and the maximum range used in a normalization operation into decimal numbers, (d) obtaining differential data and predicted differential data of the quantized key value data and performing a circular quantization operation on the differential data and the predicted differential data so as to reduce their ranges, (e) generating a bitstream, into which the key value data are encoded, by entropy-encoding the differential data, and (f) encoding information required for decoding the bitstream to be included in the bitstream.

To achieve the above and other aspects of the present invention, there is provided an apparatus for decoding data, which decodes a bitstream into which key value data of a position interpolator representing the position of an object using x, y, and z components are encoded. The apparatus includes a key value header decoder which decodes information required for decoding from the bitstream, an entropy decoder which entropy-decodes the bitstream and outputs differential data, an inverse DPCM processor which performs an inverse circular DPCM operation or an inverse predictive-circular DPCM operation on the differential data depending on the type of DPCM performed on the differential data and thus outputs quantized key value data, an inverse quantizer which inversely quantizes the quantized key value data and outputs normalized key value data, a floating-point number decoder which receives minimum values among the key value data of each of the x, y, and z components and a maximum range among data ranges of the x, y, and z components from the key value header decoder, converts the minimum values and the maximum range into binary numbers, and outputs the binary numbers to the inverse normalizer, and an inverse normalizer which receives the minimum values among the key value data of each of the x, y, and z components and the maximum range among the data ranges of the x, y, and z components from the floating-point number decoder and inversely normalizes the key value data of the x, y, and z components.

To achieve the above and other aspects of the present invention, there is provided a method for decoding data, which decodes a bitstream into which key value data of a position interpolator representing the position of an object using x, y, and z components are encoded. The method includes (a) decoding header information required for decoding from the bitstream, (b) generating differential data by entropy-decoding the bitstream, (c) generating quantized key value data by performing an inverse circular DPCM operation or an inverse predictive-circular DPCM operation on the differential data depending on the type of DPCM performed on the differential data, (d) converting minimum values among the key value data of each of the x, y, and z components and a maximum range among data ranges of the x, y, and z components, which have been decoded in step (a), into binary numbers and converting minimum values among the key value data of each of the x, y, and z components and a maximum value among all the key value data of the x, y, and z components into binary numbers, (e) generating normalized key value data by inversely quantizing the quantized key value data based on predetermined quantization bits, and (f) inversely normalizing the key value data based on the minimum values among the key value data of each of the x, y, and z components and the maximum range among the data ranges of the x, y, and z components, which have been converted in step (d).

BRIEF DESCRIPTION OF THE DRAWINGS

The above objects and advantages of the present invention will become more apparent by describing in detail preferred embodiments thereof with reference to the attached drawings in which:

FIG. 12A is a block diagram of an apparatus for decoding data using an inverse normalizer according to a preferred embodiment of the present invention.

FIG. 13B is a flowchart of a method for decoding key value data;

FIGS. 19 through 27 are diagrams showing examples of program codes by which a process of reading a bitstream in a method for decoding data according to a preferred embodiment of the present invention is realized.

DETAILED DESCRIPTION OF THE INVENTION

Hereinafter, the present invention will now be described more fully with reference to the accompanying drawings.

Figure 2A:
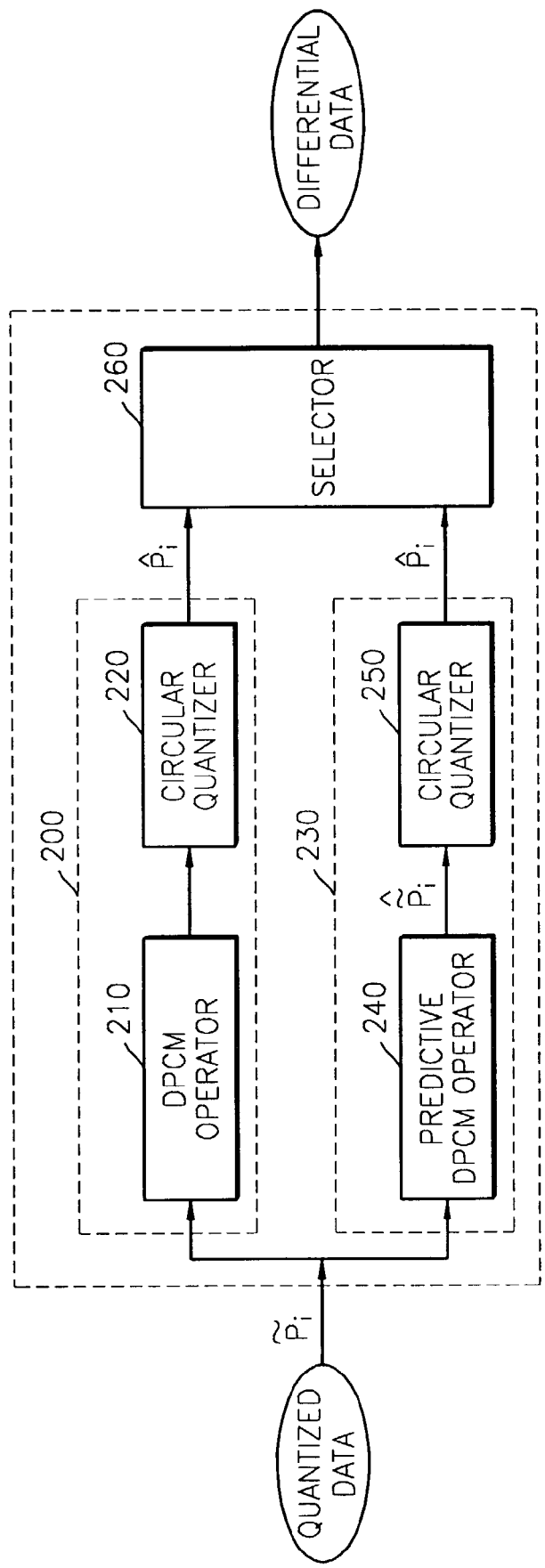
FIG. 2A is a block diagram of an apparatus for performing a DPCM operation according to a preferred embodiment of the present invention.
Figure 2B:
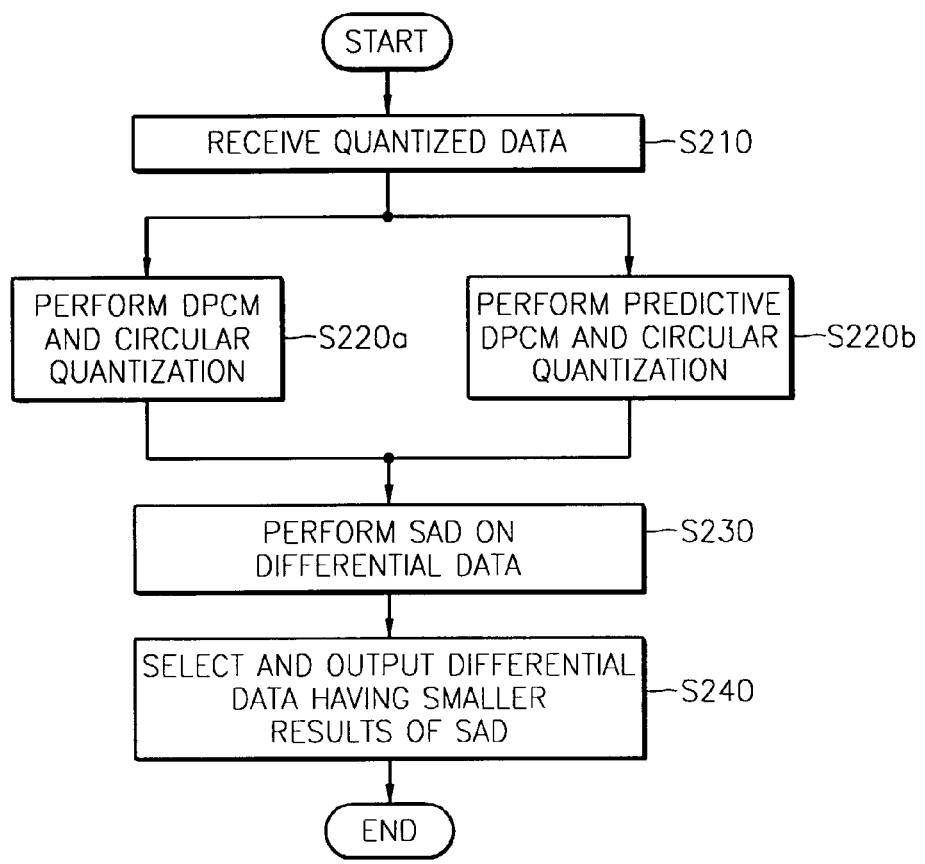
FIG. 2B is a flowchart of a DPCM operation according to a preferred embodiment of the present invention.

FIG. 2A is a block diagram of an apparatus for performing a DPCM operation according to a preferred embodiment of the present invention, and FIG. 2B is a flowchart of a DPCM operation according to a preferred embodiment of the present invention.

Referring to FIG. 2A, an apparatus for performing a DPCM operation according to a preferred embodiment of the present invention includes a circular DPCM operator 200, which includes a DPCM operator 210 performing a general DPCM operation and then outputting differential data and a circular quantization operator 220 performing a circular quantization operation on differential data input thereinto so as to reduce their range, a predictive-circular DPCM operator 230, which includes a predictive DPCM operator performing a predictive DPCM operation on quantized data input thereinto and then outputting predicted differential data and a circular quantizer 250 performing a circular quantization operation on differential data input thereinto so as to reduce their range, and a selector 260, which selects one from between the differential data input from the circular DPCM operator 200 and the differential data input from the predictive-circular DPCM operator 230 based on the value of the differential data input thereinto.

Referring to FIG. 2B, a DPCM operation according to a preferred embodiment of the present invention will be described in the following.

Data, which are quantized following an arbitrary quantization method, are input into the circular DPCM operator 200 and the predictive-circular DPCM operator 230 in step S210.

In the circular DPCM operator 200, the DPCM operator 210 generates differential data by performing a general DPCM operation on the quantized data input thereinto and outputs the generated differential data to the circular quantizer 220. The circular quantizer 220, then, performs a circular quantization on the differential data input from the DPCM operator 210 in step S220a.

In particular, the DPCM operator 210 calculates the differential data by subtracting previous quantized data from the current quantized data input in step S210. Thereafter, the circular quantizer 220 performs circular quantization on the calculated differential data. The operation of the circular DPCM operator 200 is expressed by the following equation.

$$\hat{P}_i = \text{CircularQuantization}(\tilde{P}_i - \tilde{P}_{i-1}) \quad (i=1, 2, \ldots, n) \quad (1)$$

In Equation (1), n represents the number of data. The circular quantization will be described later.

The predictive DPCM operator 240 in the predictive-circular DPCM operator 230 calculates predicted differential data by performing a predictive DPCM operation on differential data input thereinto, and then the circular quantizer 250 performs a circular quantization on the predicted differential data in step S220b.

In particular, the predictive DPCM operator 240 generates the predicted differential data by subtracting predicted data from current quantized data and outputs them. In order to obtain the predicted data for the current quantized data, differential values are obtained by subtracting from previous quantized data quantized data prior to the previous quantized data and then are added to previous differential data so that the predicted data for the current data are calculated.

The predicted data calculated by the predictive DPCM operator 240 may not be beyond a maximum range of quantized data input thereinto. In other words, if the predicted data exceed a maximum value in a quantization range of the input quantized data, the predictive DPCM operator 240 sets up the predicted data as a maximum value in a quantization range of the input quantized data and generates differential data for current data by subtracting the current data from the predicted data. If the predicted data are smaller than a minimum value in the quantization range of the input data, the predictive DPCM operator 240 determines the current data as predicted differential data. Hereinafter, this operation of the predictive DPCM operator 240 will be referred to as a "modified predictive DPCM operation" in the following.

The predicted differential data calculated by the predictive DPCM operator 230 are input into the circular quantizer 250 and are subjected to a circular quantization operation.

The operation of the predictive-circular DPCM operator 230 may be expressed by the following equation.

$$\hat{\tilde{P}}_i = (2^{nQuantBit} - 1) - \tilde{P}_i \quad \tilde{P}_i (\text{if } 2 \times \tilde{P}_{i-1} - \tilde{P}_{i-2} > 2^{nQuantBit} - 1) \quad (2)$$
$$\hat{\tilde{P}}_i = \tilde{P}_i \quad (\text{if } 2 \times \tilde{P}_{i-1} - \tilde{P}_{i-2} < 0)$$
$$\hat{\tilde{P}}_i = \tilde{P}_i - (2 \times \tilde{P}_{i-1} - \tilde{P}_{i-2}) \quad (\text{otherwise})$$
$$\hat{P}_1 = \text{CircularQuantization}(\hat{\tilde{P}}_i)$$

In Equation (2), i is an integer between 2 and n−1, and n indicates the number of data.

Figure 16A:
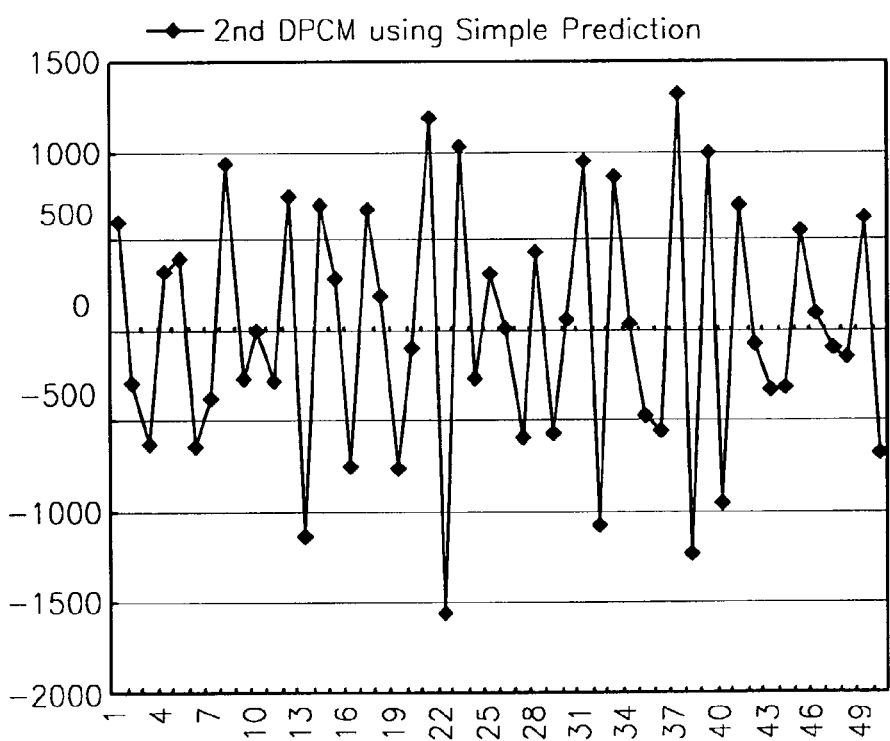
FIGS. 16A and 16B are graphs illustrating the results of a predictive DPCM operation according to a preferred embodiment of the present invention.
Figure 16B:
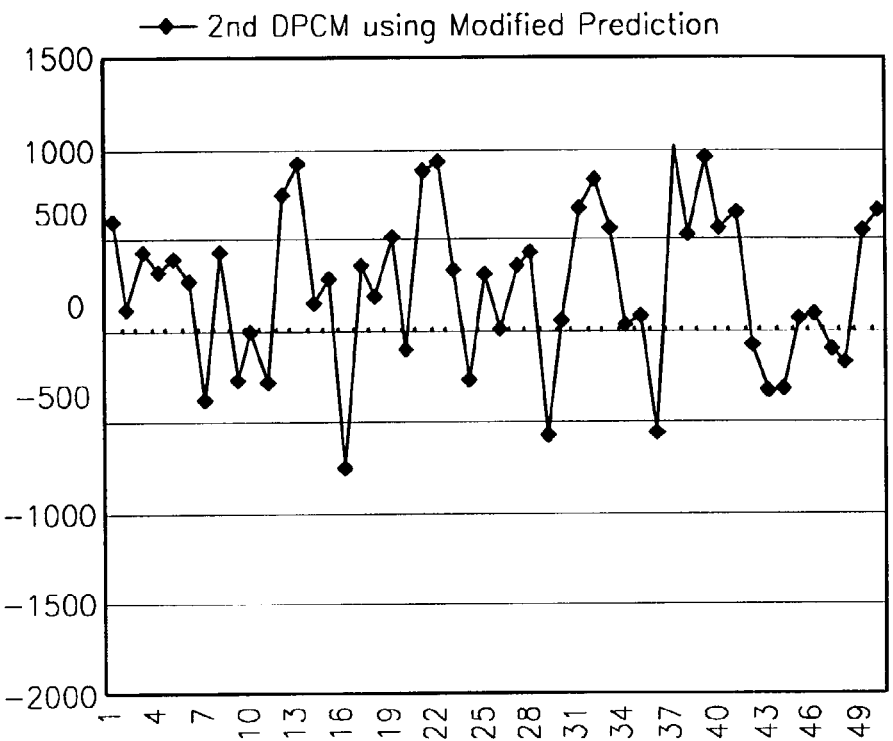

FIG. 16A shows the results of performing a simple predictive DPCM operation on 50 quantized data having a maximum value of 1024 and a minimum value of 0, and FIG. 16B shows the results of performing a modified predictive DPCM operation on the same data as in the case of FIG. 16A so that differential data for the data are adjusted following Equation (2), in a case where predicted data values for the data are beyond the maximum value or below the minimum value among the data.

As a result of the simple predictive DPCM operation, predicted differential data have as wide a range as about 3,000, as shown in FIG. 16A. As a result of the modified predictive DPCM operation, predicted differential data have as narrow a range as no greater than 2,000, as shown in FIG. 16B. This means that it is more likely to obtain predicted differential data having a narrower range in the modified predictive DPCM operation than in the simple predicted DPCM operation.

Hereinafter, circular quantization will be described in the following.

Figure 17A:
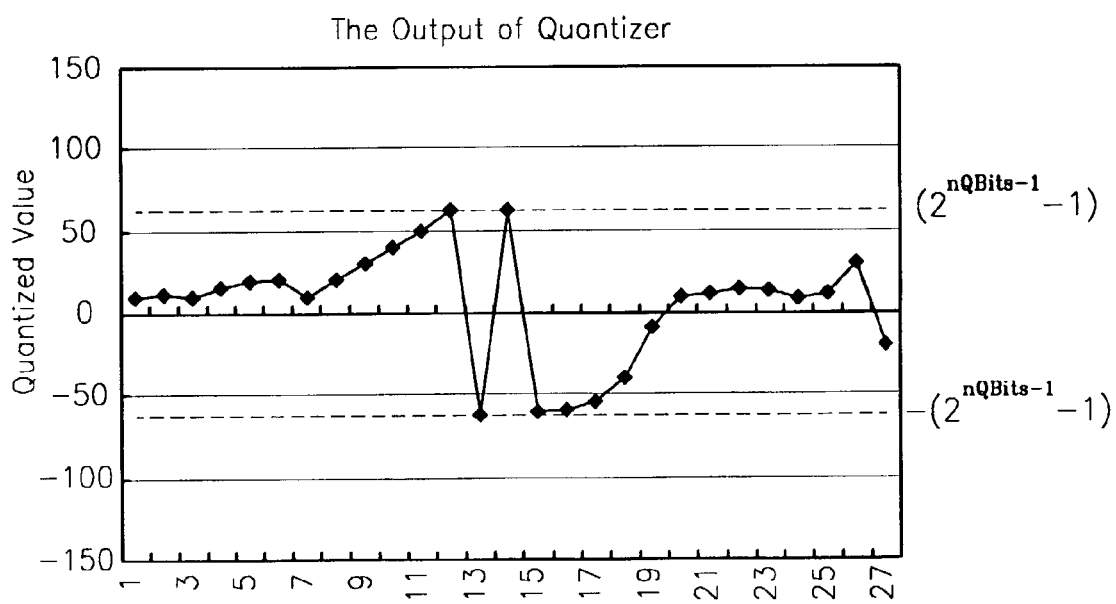
FIGS. 17A through 17C are graphs illustrating the results of a circular-DPCM operation according to a preferred embodiment of the present invention.
Figure 17B:
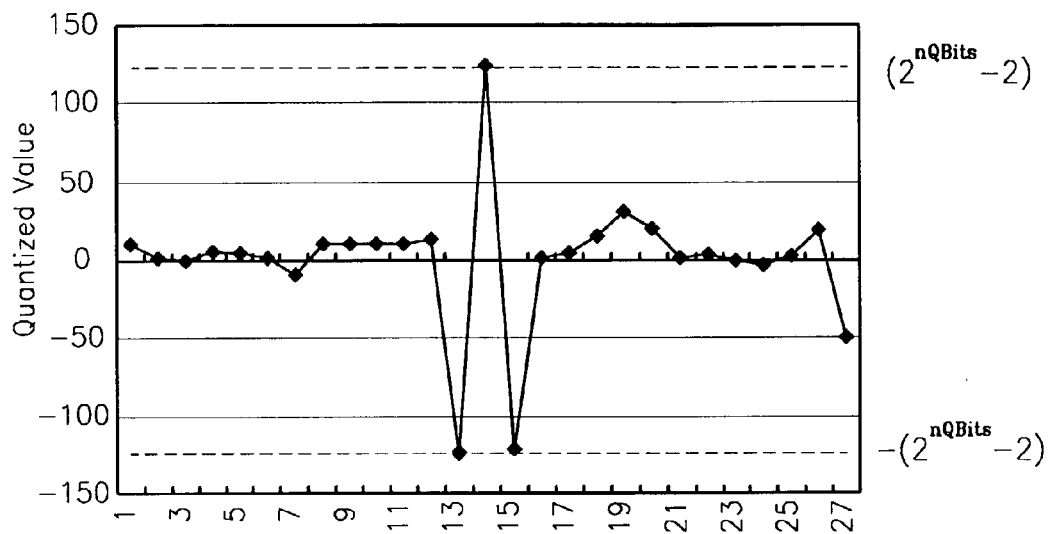

FIG. 17A shows quantized data, and FIG. 17B shows the results of performing a DPCM operation on the quantized data shown in FIG. 17A. As shown in FIG. 17B, the range of differential data can be increased after a DPCM operation up to two times as wide as it used to be before the DPCM operation. Accordingly, it is possible to say that a circular quantization operation is employed for making it happen that a DPCM operation is performed while maintaining the range of differential data subjected to the DPCM operation within the range of input data.

The circular quantization operation is performed on the assumption that a maximum value and a minimum value in a quantization range are circularly connected to each other. Accordingly, if differential data, which are the results of performing linear DPCM on two consecutive quantized data, are greater than half of the maximum value in the quantization range, their values can be decreased by subtracting the maximum value from each of the differential data.

If the differential data are smaller than half of the minimum value in the quantization range, their values can be decreased even more by adding the maximum value in the quantization range to each of the differential data.

Supposing that X and $\hat{X}$ indicate input differential data and circularly-quantized differential data, respectively, the circular quantization can be expressed by the following equation.

$$CircularQuantization(X_i)=\hat{X}_i=Min(|X'_i|,|X''_i|) \quad (3)$$

$$X'_i=X_i-(2^{nQBits}-1) \text{ (if } X \geq 0)$$

$$X'_i=X_i+(2^{nQBits}-1) \text{ (otherwise)}$$

Figure 17C:
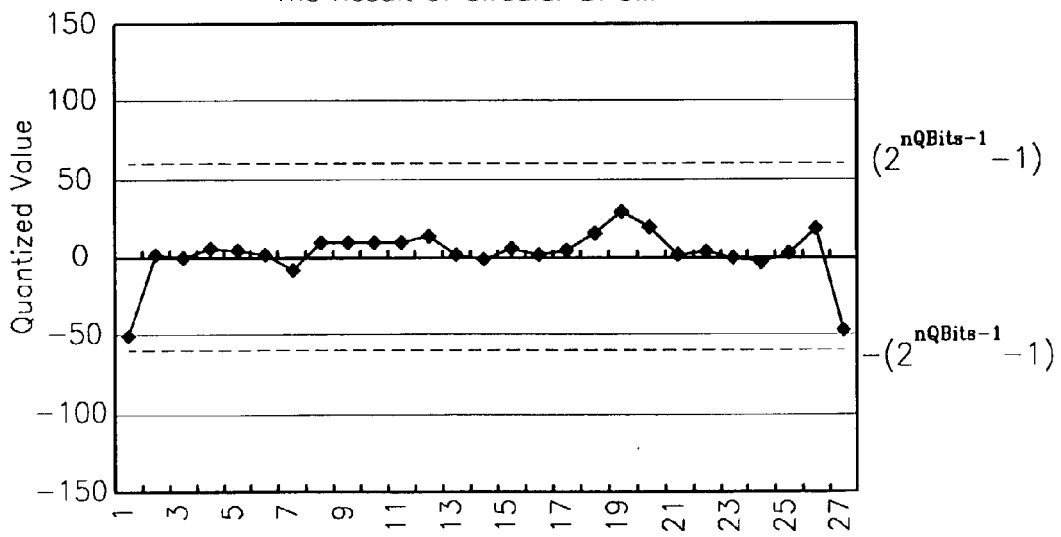

In Equation (3), nQBits indicates a bit size used for quantization. FIG. 17C shows the results of performing the circular quantization on the differential data shown in FIG. 17B.

Referring to FIG. 2B again, circularly-quantized differential data and circular-quantized predicted differential data are output to the selector 260, and then the selector 260 performs a sum-of-absolute-difference (SAD) operation on the input differential data in step S230. Here, the SAD operation is performed so that the absolute values of input data are all added. In step S230, the selector adds all the absolute values of the circular-quantized differential data and adds all the absolute values of the circular-quantized predicted differential data.

Thereafter, the selector 260 compares the sum of the absolute values of the quantized differential data and the sum of the absolute values of the predicted differential data, selects differential data having a smaller sum of absolute values from between the quantized differential data and the predicted differential data, and outputs the selected differential data in step S240. The reason why the selector 260 selects differential data having a smaller sum of absolute values is that they supposedly have a narrower range of values. For example, in entropy-encoding predicted differential data, the number of bits required for encoding differential data having a smaller sum of absolute values is expected to be smaller than the number of bits required for encoding differential data having a larger sum of absolute values.

It is obvious to one skilled in the art that the SAD operation is merely one of the methods for selecting a certain group of differential data, and thus the selector 260 may adopt a different method to select differential data.

Figure 3A:
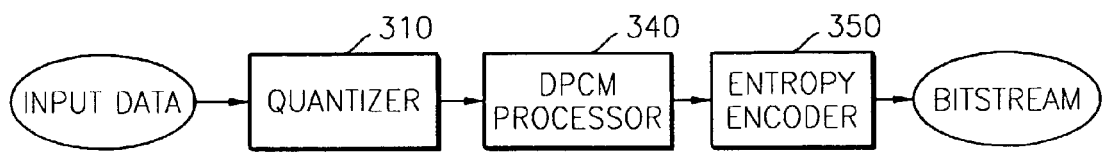
FIG. 3A is a block diagram of an apparatus for encoding data using a DPCM operator according to a preferred embodiment of the present invention.
Figure 3B:
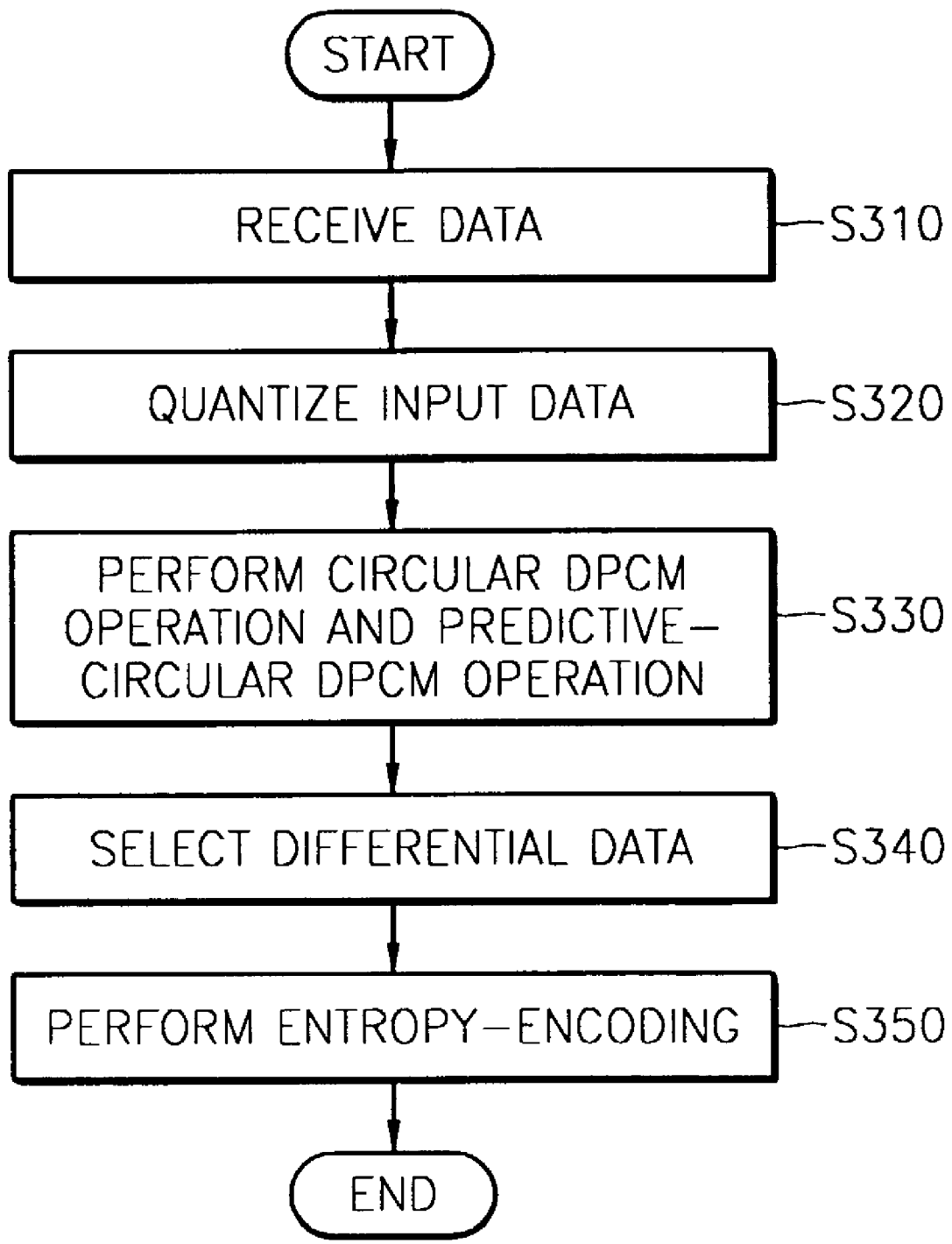
FIG. 3B is a flowchart of the operation of the apparatus for encoding data shown in FIG. 3A.

FIG. 3A is a block diagram of an apparatus for encoding data according to a first embodiment of the present invention, and FIG. 3B is a flowchart illustrating the operation of the apparatus for encoding data according to the first embodiment of the present invention. The apparatus for encoding data according to the first embodiment of the present invention includes the aforementioned DPCM operator of the present invention.

The apparatus for encoding data shown in FIG. 3A includes a quantizer 310 which quantizes input data with a predetermined quantization bit, a DPCM processor 340 which performs a circular DPCM operation and a predictive DPCM operation on the quantized data and then outputs differential data, and an entropy encoder 350 which performs a predetermined entropy-encoding operation on the differential data input from the DPCM processor 340 and then outputs a bitstream. The DPCM processor 340 comprises the aforementioned DPCM operator of the present invention.

Referring to FIGS. 3A and 3B, data to be encoded are input into the apparatus for encoding data in step S310, and are quantized with a predetermined number of quantization bits in the quantizer 310 and output to the DPCM processor 340 in step S320.

The circular DPCM operator 200 in the DPCM processor 340 performs a DPCM operation and a circular quantization operation on the quantized data input from the quantizer 310 and then outputs the results to the selector 260. In addition, the predictive-circular DPCM operator performs a predictive DPCM operation and circular quantization on the quantized data input from the quantizer 310 in step S330.

The selector 260 performs an SAD operation on the differential data input from the circular DPCM operator 200 and the differential data input from the predictive-circular DPCM operator 230, selects differential data to be output to the entropy decoder 350, and outputs the selected differential data in step S340.

The entropy encoder 350 performs a predetermined entropy-encoding operation on the differential data input from the selector 260 so that they are entropy-encoded and a bitstream is generated in step S350.

Figure 4A:
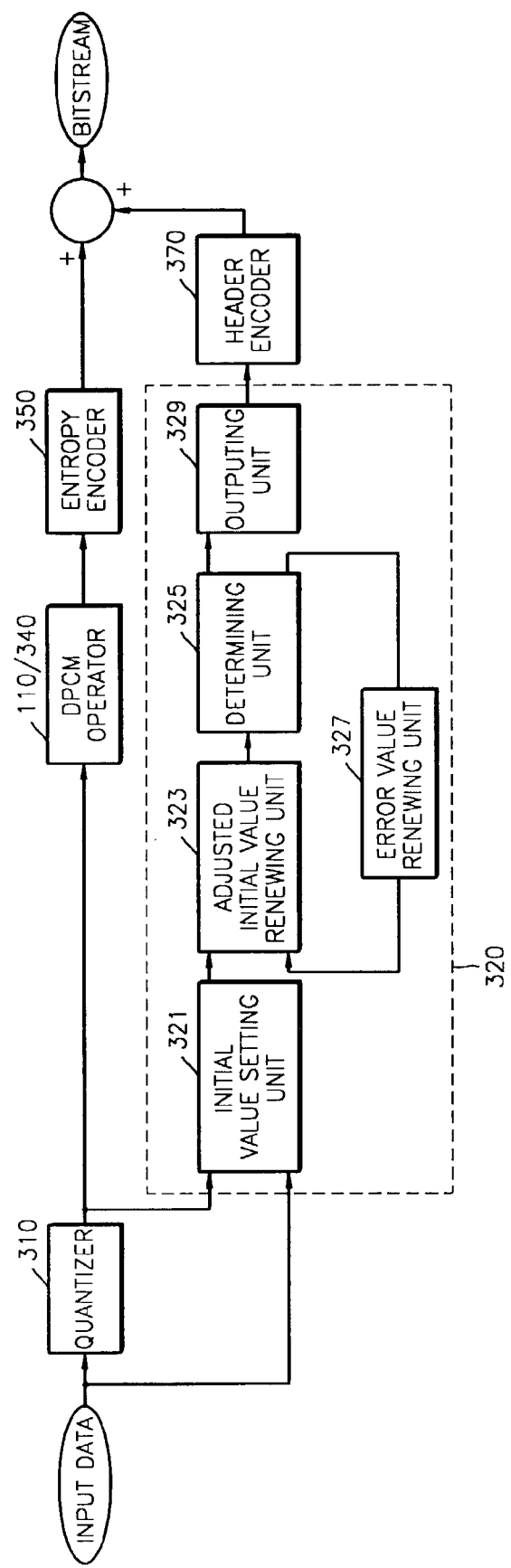
FIG. 4A is a block diagram of an apparatus for encoding data according to a preferred embodiment of the present invention, which can minimize a quantization error.
Figure 4B:
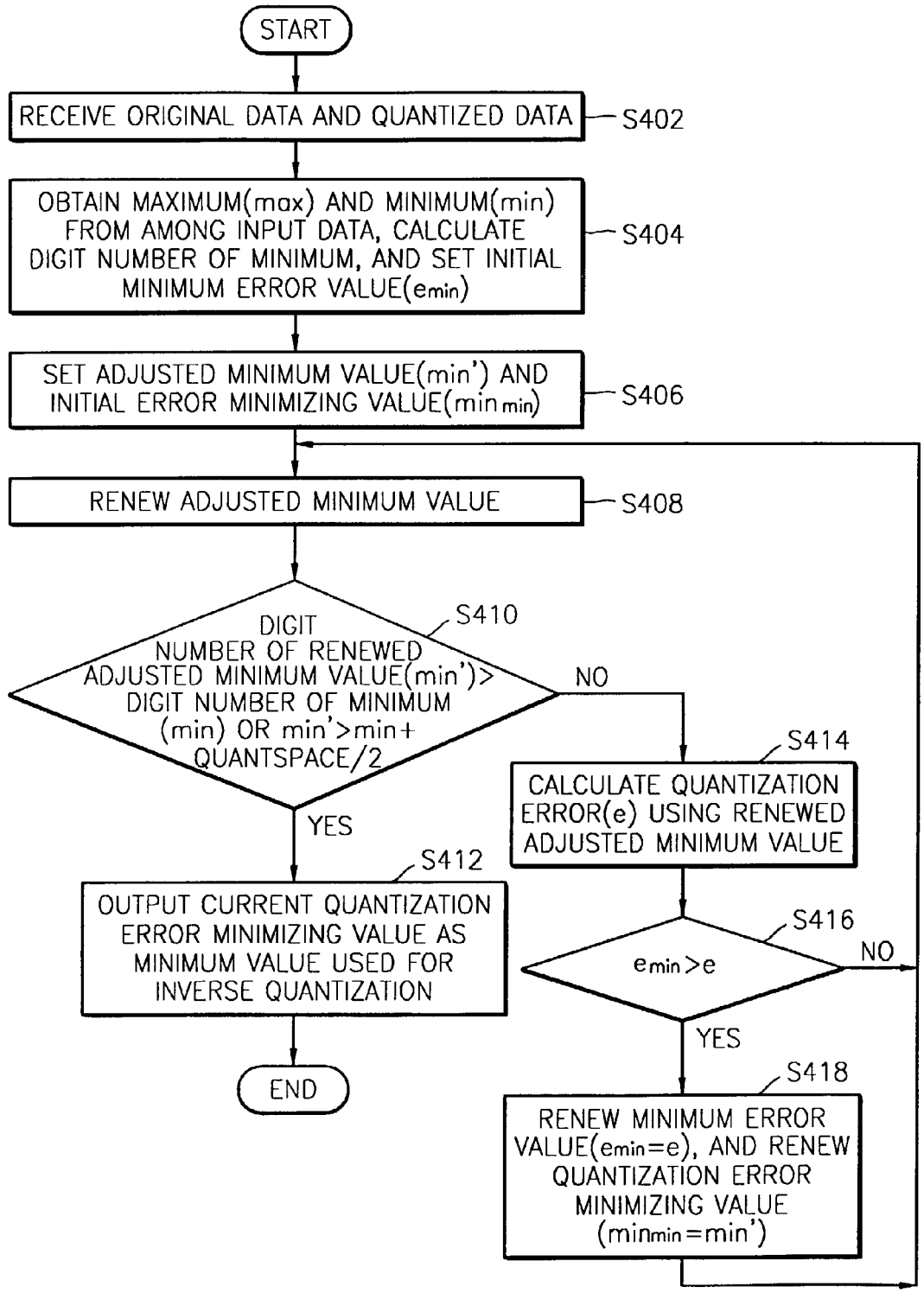
FIG. 4B is a flowchart of a method of minimizing a quantization error.

FIG. 4A is a block diagram of an apparatus for encoding data according to a second embodiment of the present invention, and FIG. 4B is a flowchart of the operation of a quantization error minimizer shown in FIG. 4A.

An apparatus for encoding data according to a second embodiment of the present invention includes a maximum value and a minimum value used for minimizing a quantization error in a bitstream and encodes the bitstream so that a quantization error can be minimized when decoding encoded data.

Referring to FIG. 4A, an apparatus for encoding data according to a preferred embodiment of the present invention includes a quantizer 310, a DPCM operator 110/340, an entropy encoder 350, a quantization error minimizer 320 which receives data and quantized data, adjusts a maximum value and a minimum value among the data so that the quantization error can be minimized, and outputs the adjusted maximum and minimum values, and a header encoder 370 which encodes the maximum and minimum values input from the quantization error minimizer 320 into header information and lets the information included in a bitstream.

The quantization error minimizer 320 includes an initial value setting unit 321 which sets a minimum error value $e_{min}$, an adjusted minimum value min', and a quantization error minimum value $min_{min}$, an adjusted minimum value renewing unit 323 which renews the adjusted minimum value min' by performing a predetermined operation, a determining unit 325 which determines the quantization error minimizing value $min_{min}$ as a minimum value to be used for inverse quantization based on the digit number and value of the renewed adjusted minimum value, an error value renewing unit 327 which calculates a quantization error value using the renewed adjusted minimum value, renews the adjusted minimum value min' and the calculated error value into the quantization error minimum value $min_{min}$ and the minimum error value $e_{min}$, respectively, if the calculated error value is smaller than the minimum error value $e_{min}$, and outputs the results of the renewal to the adjusted minimum value renewing unit 323.

The quantization error minimizer 320 controls a quantization range so as to minimize a quantization error by performing quantization and inverse quantization on input data.

In particular, when Max represents a fixed maximum value to be used for quantization, Min represents an adjusted minimum value to be used for quantization, $X_i$ represents an input value, and nQuanBit represents the number of bits used for quantization, a quantized input value $\tilde{X}_i$, an inversely quantized value $\hat{X}_i$, and an error $e_i$ are calculated following Equation (4).

$$\tilde{X}_i = \text{floor}\left(\frac{X_1 - \text{Min}}{\text{Max} - \text{Min}} * (2^{nQuantBit} - 1) + 0.5\right) \quad (4)$$

$$\hat{X}_i = \frac{\tilde{X}_i^*(\text{Max} - \text{Min})}{2^{nQuantBit} - 1} + \text{Min}$$

$$e_i = X_i - \hat{X}_i$$

In order to reduce the sum $$\sum e_i$$

of errors, the quantization error minimizer 320 controls Min so that the sum $$\sum e_i$$

of errors can be minimized and decodes quantized data using a minimum value which can minimize a quantization error in decoding data.

The quantizer 310, the DPCM operator 110/340, and the entropy encoder 350 are almost the same as the corresponding elements of the aforementioned apparatus for encoding data, and thus their detailed description will not be repeated here. Hereinafter, the operation of the quantization error minimizer 320 will be described more fully with reference to FIG. 4B.

The initial value setting unit 321 receives the same data as data input into the quantizer 310 as well as quantized data output from the quantizer 310 in step S402.

The initial value setting unit 321 obtains a maximum value max and a minimum value min from among the input data and calculates the digit number of the minimum value min. Next, the initial value setting unit 321 calculates a quantization error e by inversely quantizing the quantized data using the maximum value max and the minimum value min and sets the quantization error e as an initial minimum error value $e_{min}$ in step S404.

The initial value setting unit 321 subtracts the result of dividing a quantization step size QuantSpace by 2 from the minimum value min among the input data and sets the result of the subtraction as an initial adjusted minimum value min'. Then, the initial value setting unit 321 sets the initial adjusted minimum value min' as a quantization error minimum value $\text{min}_{min}$ and outputs the adjusted minimum value min' to the adjusted minimum value renewing unit 323 in step S406.

The adjusted minimum value renewing unit 323 renews the adjusted minimum value min' input from the initial value setting unit 321 by performing a predetermined operation. According to a preferred embodiment of the present invention, the adjusted minimum value renewing unit 323 renews the adjusted minimum value min' input from the initial value setting unit 321 following Equation (5) and outputs the renewed adjusted minimum value min' to the determining unit 325 in step S408.

$$\text{min}' = \frac{\text{Mantissa}(\text{min}') + 1}{10^{\text{Exponent}(\text{min}')}} \quad (5)$$

The determining unit 325 calculates the digit number of the renewed adjusted minimum value min', compares the result of the calculation with the digit number of the minimum value min among the input data, which is calculated by the initial value setting unit 321, and compares the renewed adjusted minimum value min' with the result of adding the minimum value min among the input data to the result of dividing the quantization bit size QuantSpace by 2, in step S410.

If the digit number of the renewed adjusted minimum value min' is greater than the digit number of the minimum value min among the input data, or if the renewed adjusted minimum value min' is greater than min $$\text{min} + \frac{QuantSpace}{2},$$

the determining unit 325 determines the currently stored quantization error minimizing value $\text{min}_{min}$ as a minimum value to be used for inverse quantization and outputs the quantization error minimizing value $\text{min}_{min}$ to the outputting unit 329. If the digit number of the renewed adjusted minimum value min' is not greater than the digit number of the minimum value min among the input data and the renewed adjusted minimum value min' is not greater than min $$\text{min} + \frac{QuantSpace}{2},$$

the determining unit 325 outputs the renewed adjusted minimum value min' to the error value renewing unit 327.

The error value renewing unit 327 inversely quantizes the quantized data using the renewed adjusted minimum value min' and the maximum value max obtained by the initial value setting unit 321 and calculates the quantization error e in step S414.

The error value renewing unit 327 compares the newly calculated error value e with the minimum error value $e_{min}$ in step S446. As a result of the comparison, if the newly calculated error value e is smaller than the minimum error value $e_{min}$, the error value renewing unit 327 renews the minimum error value $e_{min}$ with the newly calculated error value e and renews the quantization error minimum value $\text{min}_{min}$ with the renewed adjusted minimum value min' in step S418. On the other hand, if the newly calculated error value e is greater than the minimum error value $e_{min}$, the error value renewing unit 327 performs step S408 again without renewing the minimum error value $e_{min}$ and the quantization error minimum value $\text{min}_{min}$.

The maximum and minimum values used for minimizing a quantization error, which are obtained through the above-mentioned processes, are output to the header encoder 370 and are encoded as header information. Then, the header information is included in a bitstream generated by the entropy encoder 350.

Figure 5A:
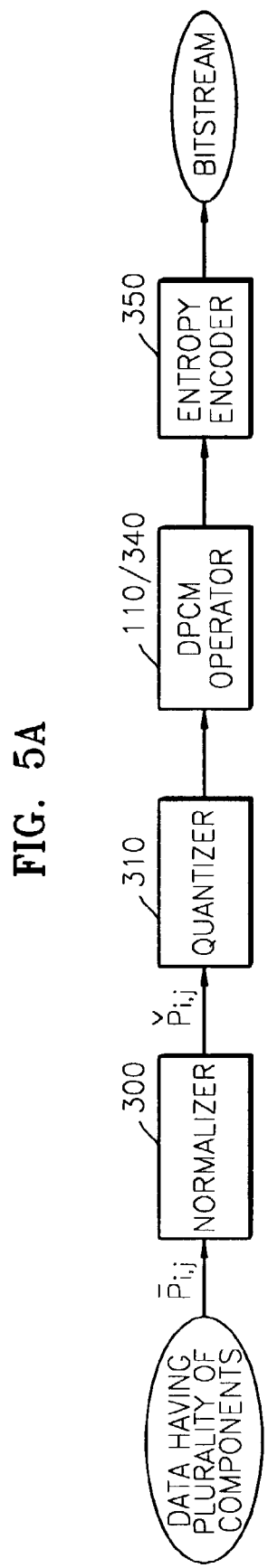
FIG. 5A is a block diagram of an apparatus for encoding data according to a preferred embodiment of the present invention, which normalizes input data having a plurality of components and then encodes the normalized data.
Figure 5B:
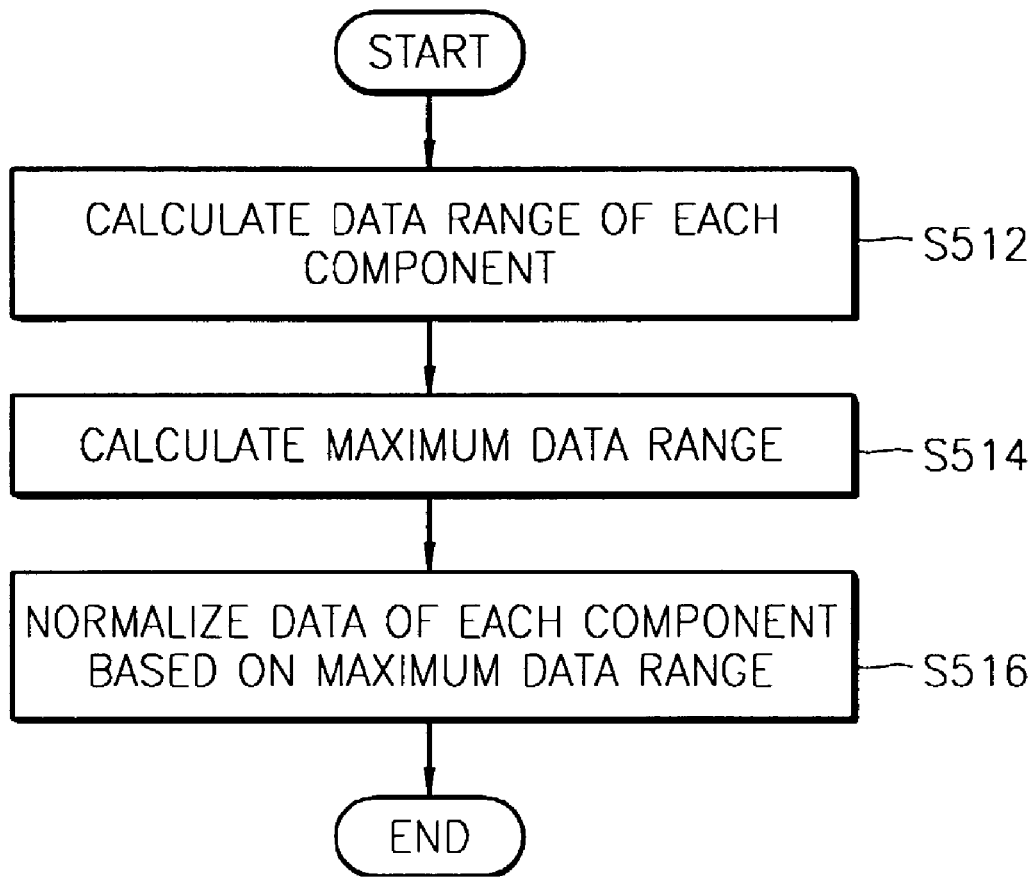
FIG. 5B is a flowchart of a method of normalizing data.

FIG. 5A is a block diagram of an apparatus for encoding data according to a third embodiment of the present invention, and FIG. 5B is a flowchart of the operation of a normalizer shown in FIG. 5A. An apparatus for encoding data according to a third embodiment of the present invention increases the efficiency of encoding data by normalizing input data having a plurality of components.

As shown in FIG. 5A, an apparatus for encoding data according to a third embodiment of the present invention includes a normalizer 300 which calculates a maximum range among data ranges of components input into the apparatus for encoding data and normalizes data of each of the x, y, and z components based on the maximum range, a quantizer 310 which quantizes normalized data with a predetermined number of quantization bits, a DPCM operator 110/340 which performs a DPCM operation on quantized data and outputs differential data, and an entropy encoder 350 which entropy-encodes differential data and then outputs an encoded bitstream.

The quantizer 310, the DPCM operator 110/340, and the entropy encoder 350 are the same as the corresponding elements of the apparatus for encoding data according to the first embodiment of the present invention, and thus their detailed description will not be repeated here. Only the operation of the normalizer 300 will be described in the following with reference to FIG. 5B.

In a case where data to be encoded comprises a plurality of components, for example, if input data consists of three components x, y, and z to represent the location of an object in a three-dimensional space, each of the x, y, and z components is input into the normalizer 300 of the apparatus for encoding data. Then, the normalizer 300 calculates a maximum range among the ranges of the x, y, and z components and normalizes data of each of the x, y, and z components based on the maximum range.

The normalizer 300 receives data of each component and calculates data ranges of the x, y, and z components following Equation (6) in step S512. Then, the normalizer 300 calculates a maximum range among the data ranges of the x, y, and z components by comparison in step S514.

$$Max_j = Max_{i=0}^{n}(\overline{P}_{ij})$$

$$Min_j = Min_{i=0}^{n}(\overline{P}_{ij})$$

$$Range_{max} = Max(Max_x - Min_x, Max_y - Min_y, Max_z - Min_z) \quad (6)$$

Thereafter, the normalizer 300 normalizes the data of each of the x, y, and z components using the following equation in step S516.

$$\breve{P}_{ij} = \frac{\overline{P}_{ij} - Min_j}{Range_{max}} \quad (7)$$

In Equations (6) and (7), n represents the number of data, i=0, 1, ..., n−i, and j represents each of the components x, y, and z. As shown in Equation (7), the x, y, and z components are normalized using the maximum range $Range_{max}$ among their data ranges. As a result of such normalization, the redundancy of data regarding components not having the maximum range $Range_{max}$ increases, and accordingly, the efficiency of encoding data also increases.

The normalizer 300 normalizes each of the components of the input components and outputs the results of the normalization to the quantizer 310, and then the quantizer 310 quantizes the normalized data input from the normalizer 300 with a predetermined number of quantization bits and outputs the results of the quantization to the DPCM operator 110/340. Thereafter, the DPCM operator 110/340 generates differential data by performing a DPCM operation on the quantized data input from the quantizer 310 and outputs the differential data to the entropy encoder 350 so that they can be encoded.

Hereinafter, an apparatus for encoding data according to a fourth embodiment of the present invention, into which the aforementioned DPCM operator of the present invention, the aforementioned apparatus for encoding data according to the present invention which is capable of minimizing a quantization error, and the aforementioned apparatus for encoding data according to the present invention, which is capable of encoding data having a plurality of components, are integrated, will be described.

Even though an apparatus for encoding data according to a fourth embodiment of the present invention will be specifically described as encoding key value data of a position interpolator among three-dimensional animation data in the following, it can also encode other general types of data obviously.

A position interpolator is information on the position of a path of an animation in a key frame-based animation which is one of basic techniques of representing a computer-synthesized 3D animation. The key frame-based animation is used for defining the order of animations based on the moment when key data appear. A frame corresponding to the moment when key data appear is called a key frame.

In the key frame-based animation, a plurality of key frames and frames among the key frames constitute an animation, and the frames are interpolated among the key frames (or the frames among the key frames are generated using interpolation). International multimedia standards, such as MPEG-4 binary format for scene (BIFS) and virtual reality modeling language (VRML), support a key frame-based animation using an interpolator node. In MPEG-4 BIFS and VRML, there are various kinds of interpolators including a scalar interpolator, a position interpolator, a coordinate interpolator, an orientation interpolator, a normal interpolator, and a color interpolator. These interpolators and their functions and characteristics are shown in Table 1.

TABLE 1

| Kind of Interpolator | Characteristics | Function |
| --- | --- | --- |
| Scalar interpolator | Linear interpolation of scalar variations | Capable of representing area, diameter, and intensity |
| Position interpolator | Linear interpolation on 3D coordinates | Parallel movement in 3D space |
| Orientation interpolator | Linear interpolation of 3D coordinate axis and amount of rotation | Rotation in 3D space |
| Coordinate interpolator | Linear interpolation of variations in 3D coordinates | 3D morphing |
| Normal interpolator | Linear interpolation of 3D coordinates of normal | Capable of representing variations in 3D vector of normal |
| Color interpolator | Linear interpolation of color information | Capable of representing variations in color |

The position interpolator shown in Table 1 is used to show the position information of a keyframe-based animation and is comprised of keys and key value fields. Key fields represent the position of each key frame on a temporal axis using discontinuous numbers in a range between −∞ and ∞. Each of the key value fields specifies information on the position of an object at a moment represented by each of the keys and includes three components x, y, and z. Each of the key value fields includes as many key values as each of the key fields has.

Figure 18A:
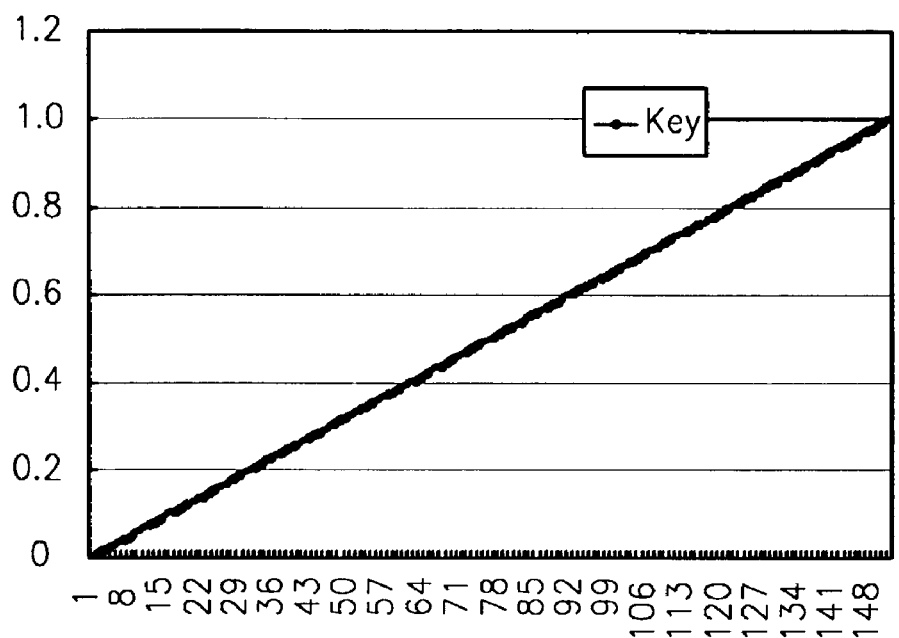
FIGS. 18A and 18B are graphs illustrating keys of a position interpolator and key value data.
Figure 18B:
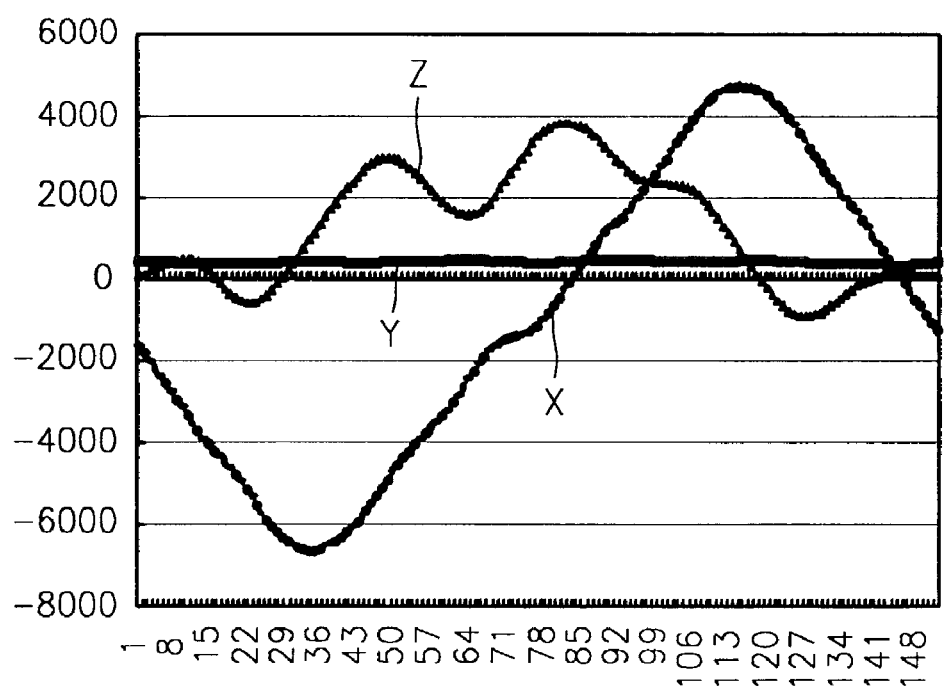

An example of the position interpolator is shown in FIGS. 18A and 18B. In particular, FIG. 18A shows key data, and FIG. 18B shows key value data. Linear interpolation has been employed in MPEG-4 BIFS and VRML. However, in order to represent an animation smoothly and naturally using linear interpolation, a considerable amount of key data and key value data has been required. In addition, in order to store and transmit such an animation, a storage having a large capacity and plenty of time have been required. Accordingly, it is preferable to compress interpolators to store and transmit the interpolators.

Figure 1:
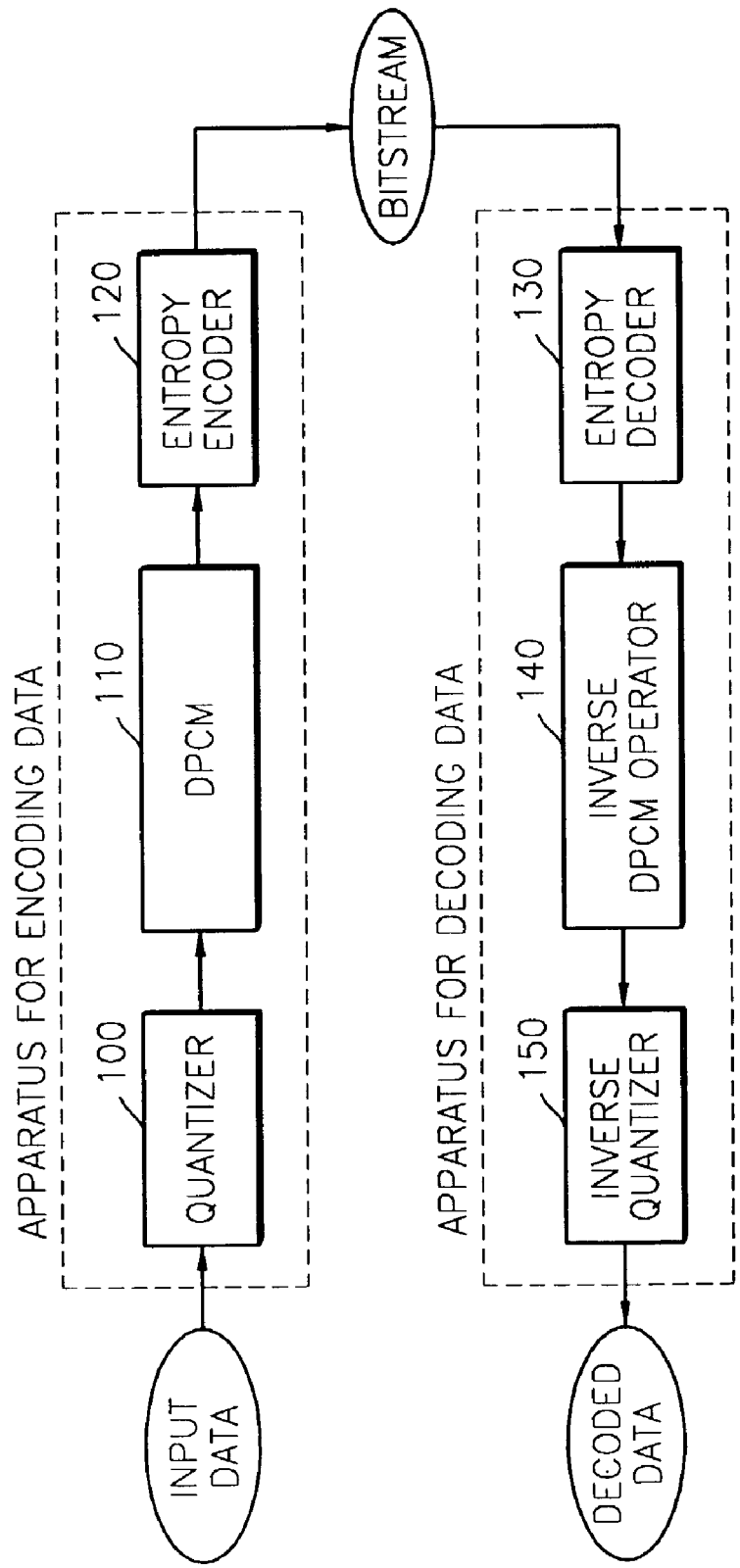
FIG. 1 is a block diagram showing the structures of a conventional apparatus for encoding data and a conventional apparatus for decoding data.

In MPEG-4 BIFS, a method for encoding and decoding an interpolator node called predictive MF coding (PMFC) has been used. In the PMFC method, like the operation of the conventional apparatus for encoding data shown in FIG. 1, key value data of a position interpolator are encoded using a quantizer, a DPCM operator, and an entropy encoder. The quantizer and the DPCM operator reduces redundant key value data, and the output of the DPCM operator is input into the entropy encoder. However, in the PMFC method, differential data obtained by a DPCM operation are entropy-encoded, and thus the encoding efficiency is not high enough. In addition, due to the limits that the entropy encoder has, it is almost impossible to provide an animation of high quality.

Figure 6A:
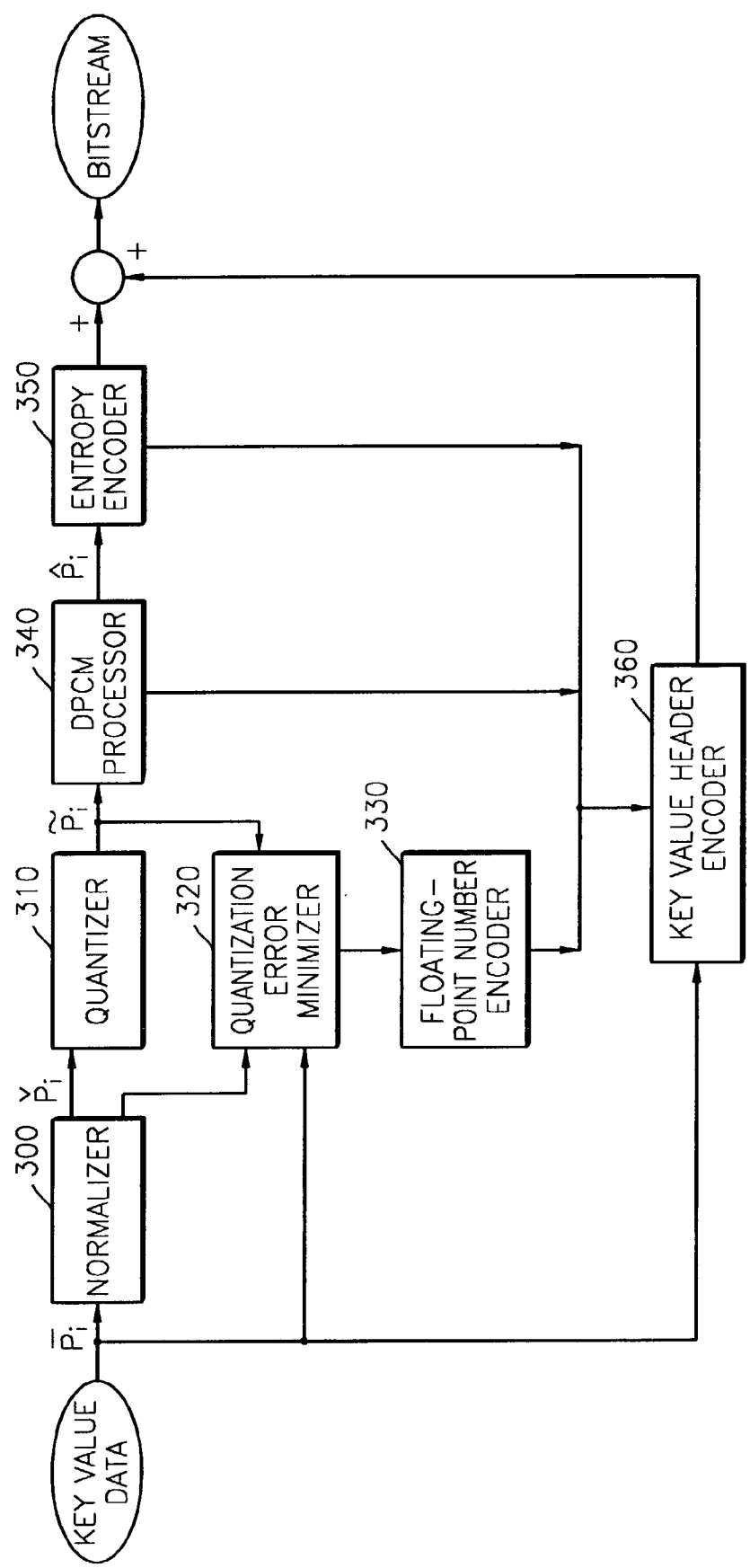
FIG. 6A is a block diagram of an apparatus for encoding data which encodes key value data of a position interpolator according to a preferred embodiment of the present invention.
Figure 6B:
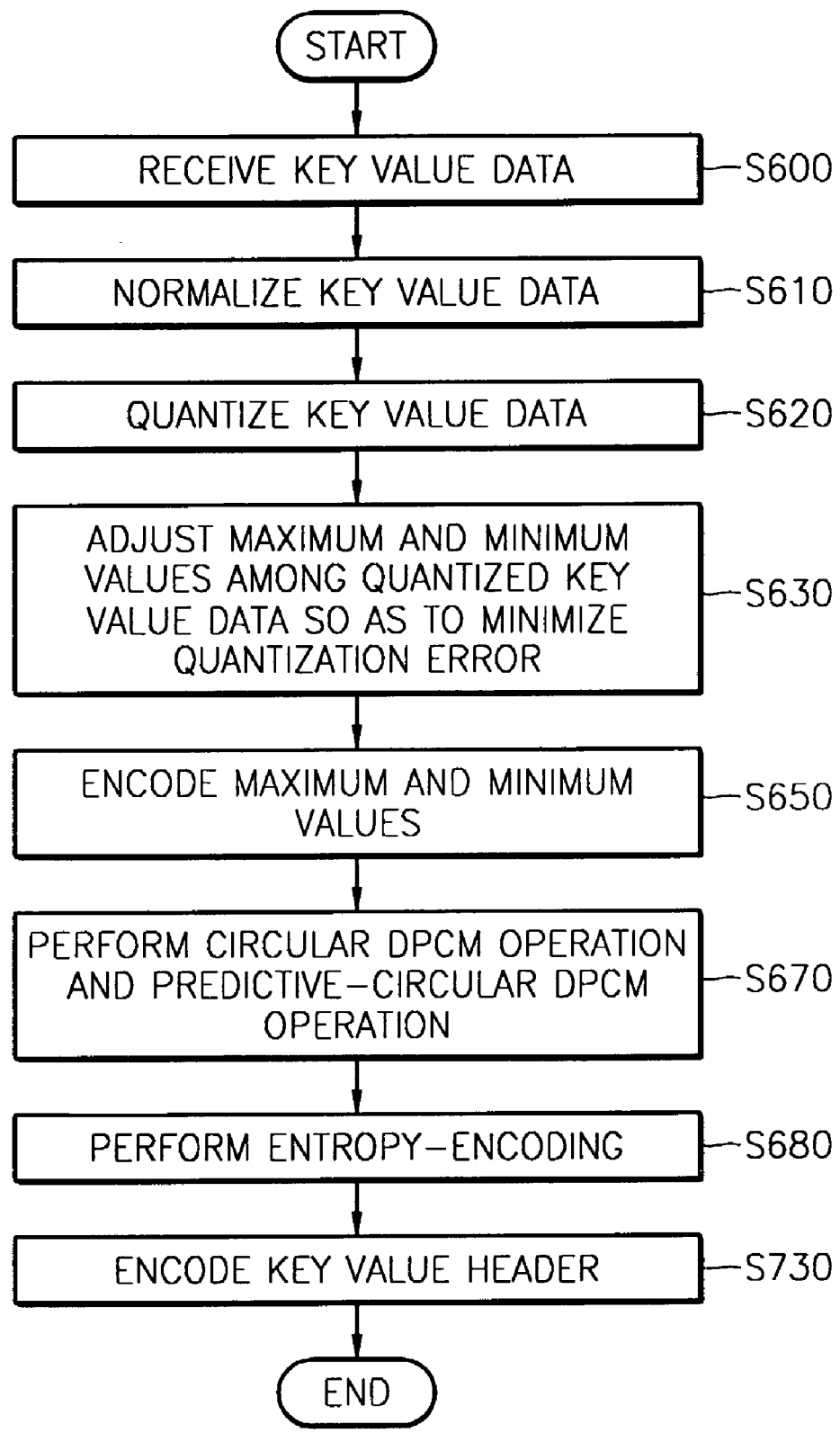
FIG. 6B is a flowchart of a method of encoding key value data.

Accordingly, the present invention provides an apparatus for encoding key values into which the aforementioned DPCM operator according to the present invention, the aforementioned apparatus for encoding data according to the present invention which is capable of minimizing a quantization error, and the aforementioned apparatus for encoding data according to the present invention, which is capable of encoding data having a plurality of components, are integrated, thus increasing the efficiency of encoding key value data FIG. 6A is a block diagram of an apparatus for encoding key value data according to a fourth embodiment of the present invention, and FIG. 6B is a flowchart of the operation of the apparatus for encoding key value data.

Referring to FIG. 6A, the apparatus for encoding key value data includes a normalizer 300 which normalizes input key value data of each component based on a maximum range among the data ranges of the x, y, and z components, a quantizer 310 which quantizes normalized key value data with a predetermined quantization bit, a quantization error minimizer 320 which receives the minimum values and the maximum range from the normalizer 300 and adjusts and outputs maximum and minimum values so that a quantization error can be minimized, a floating-point number encoder 330 which receives the minimum values and the maximum range from the quantization error minimizer 320 and converts the maximum range and the minimum values used for minimizing a quantization error into decimal numbers, a DPCM processor 340 which obtains differential data and predicted differential data of quantized key value data and performs a circular quantization operation so as to reduce the range of the differential data, an entropy encoder 350 which entropy-encodes differential data and then outputs a bitstream into which key value data are encoded, and a key value header encoder 360 which encodes information required for decoding a bitstream and allows the information to be included in the bitstream.

The operation of the apparatus for encoding key value data according to the present invention will be described with reference to FIG. 6B.

Key value data of each of the x, y, and z components are input into the normalizer 300 of the apparatus for encoding key value data in step S600. Then, the normalizer 300 calculates a maximum range among the data ranges of the x, y, and z components and normalizes the key value data of the input x, y, and z components based on the maximum range in step S610. The process of normalizing the key value data input into the normalizer 300 has been described above and thus will not be repeated here.

The normalized key value data of the x, y, and z components are input into the quantizer 310, and then the quantizer 310 quantizes the normalized key value data with a predetermined number of quantization bits nQuanBit following Equation (8) in step S620.

$$\tilde{P}_{ij} = \text{floor}(\overline{P}_{ij} \times (2^{nQuanBit} - 1) + 0.5) \quad (8)$$

In Equation (8), floor( ) is a function for converting an input floating-point number into a maximum integer of no greater than the input floating-point number. The quantizer 310 outputs the quantized key value data to the DPCM processor 340 and the quantization error minimizer 320.

The quantization error minimizer 320 receives the minimum values and the maximum range from the normalizer 300, calculates the minimum values and the maximum values using the minimum values and the maximum range input from the normalizer 300, determines a minimum value and a maximum value to minimize a quantization error in step S630, calculates the minimum values and the maximum range using the determined minimum and maximum values, and outputs the minimum values and the maximum range to the floating-point number converter 330 so that they are encoded into a key value header. Here, the minimum and maximum values determined by the quantization error minimizer 320 are used to minimize a quantization error.

Figure 7A:
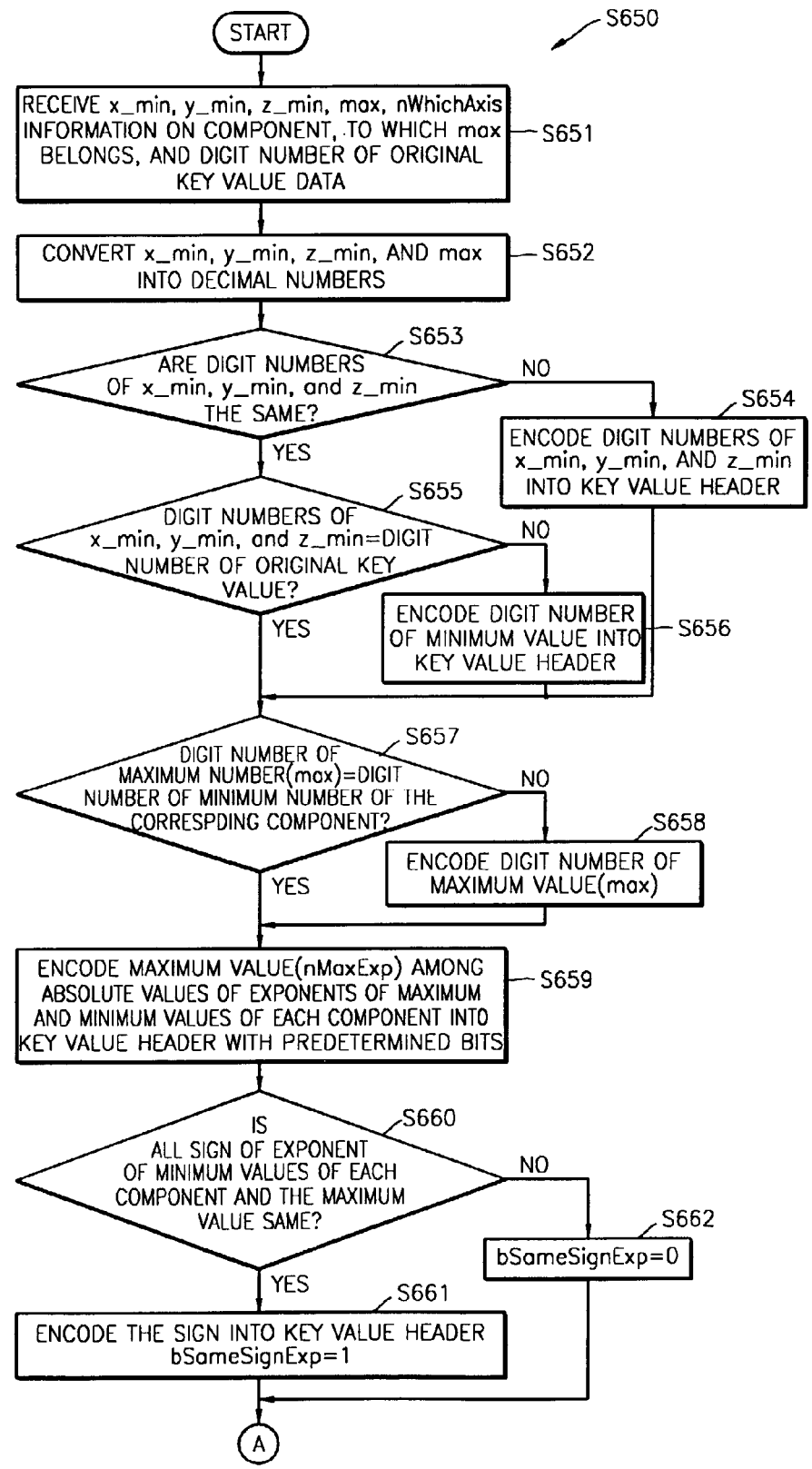
FIGS. 7A and 7B are flowcharts of the operation of a floating-point number encoder shown in FIG. 6A.

Hereinafter, step S650 performed by the floating-point number encoder 330 will be described with reference to FIG. 7A.

The floating-point number encoder 330 receives minimum values x_min, y_min, and z_min among the key value data of each of the x, y, and z components, a maximum value max of a component having the maximum range, information nWhichAxis on which component a maximum value max belongs to, and the digit number nKeyValueDigit of the original key value data in step S651.

In order to enhance the efficiency of encoding key value data by decreasing the number of bits required for encoding, the floating-point number encoder 330 converts x_min, y_min, z_min, and max, which are represented by binary numbers, into decimal numbers in step S652.

A computer stores floating-point numbers in the form of 32-bit binary numbers. When a floating-point number in the binary system is input, the floating-point number encoder 330 converts the floating-point number into a mantissa and its exponent in the decimal system, following Equation (9).

$$\underbrace{\text{mantissa\_binary} * 2^{\text{exponent\_binary}}}_{\text{floating-point number in binary system}} = \underbrace{\text{mantissa} * 10^{\text{exponent}}}_{\text{floating-point number in decimal system}} \quad (9)$$

For example, a floating-point number 12.34 in the decimal system can be converted into a binary number by a computer, which is shown in the following.

$$\underset{1}{0}\ \underset{2}{10001010111000010100011}\ \underset{3}{10000010}$$

1 : the sign

2 : the mantissa in the binary system

3 : the exponent in the binary system

The binary number can be converted back into the original decimal number following Equation (9), which is shown in the following.

$$\underset{1}{0}\ \underset{2}{1234}\ \underset{3}{2}$$

1 : the sign

2 : the mantissa in the decimal system

3 : the exponent in the decimal system

In order to include a mantissa and an exponent of the decimal system in a bitstream, the number of bits required to represent the mantissa and the number of bits required to represent the exponent must be calculated. An exponent has a value between −38 and 38 and thus may be expressed together with its sign using 7 bits. The number of bits required to represent a mantissa depends on the digit number of the mantissa. Values of various ranges and the number of bits required to represent their mantissas are shown in the following table.

TABLE 2

| Ranges of values | Digit number of mantissa | Number of bits required to represent mantissa |
|---|---|---|
| 0 | 0 | 0 |
| 1–9 | 1 | 4 |
| 10–99 | 2 | 7 |
| 100–999 | 3 | 10 |
| 1000–9999 | 4 | 14 |
| 10000–99999 | 5 | 17 |
| 100000–999999 | 6 | 20 |
| 1000000–9999999 | 7 | 24 |

The floating-point number encoder 330 checks if the digit numbers of x_min, y_min, and z_min are the same in step S453. If they are not the same, they are output to the key value header encoder 360 and are encoded as a key value header in step 654.

If the digit numbers of x_min, y_min, and z_min are the same, the floating-point number encoder 330 checks if they are the same as the digit number of the original key value data in step S655. If their digit numbers of x_min, y_min, and z_min are not the same as the digit number of the original key value data, one of the digit numbers of x_min, y_min, and z_min is output to the key value header encoder 360 and are encoded as a key header in step S656.

Thereafter, the floating-point number encoder 330 checks among which component key value data the maximum value max among all the key value data of the x, y, and z components is selected from and determines whether or not the digit number of max is the same as the digit number of a minimum value among the key value data of the component, from which the maximum value max comes, in step S657.

If the digit number of max is not the same as the digit number of the minimum value among the key value data of the component, from which the maximum value max comes, it is output to the key value header encoder 360 and is encoded as a key value header. On the other hand, if the digit number of max is the same as the digit number of the minimum value among the key value data of the component to which the maximum value max belongs to, state information describing that they are the same is output to the key value header encoder 360 in step S658.

The aforementioned operation of the floating-point number encoder 330 is for encoding the mantissa of a converted floating-point number, and a process of encoding information on the exponent of the floating-point number into a key value header will be described in the following.

The floating-point number encoder 330 identifies which one is a maximum value among the absolute values of the exponents of x_min, y_min, z_min, and max, stores the identified maximum value as nMaxExp, and encodes nMaxExp into a key value header of several bits in step S659.

Thereafter, the floating-point number encoder 330 checks if the signs of the exponents of x_min, y_min, z_min, and max are the same in step S460. If they are the same, bSameSignExp is set to 1 and their sign is output to the key value header encoder 360 in step S661. On the other hand, if they are not the same, bSameSignExp is set to 0 in step S662, and then encoding of the information on the exponents of x_min, y_min, z_min, and max are completed.

Figure 7B:
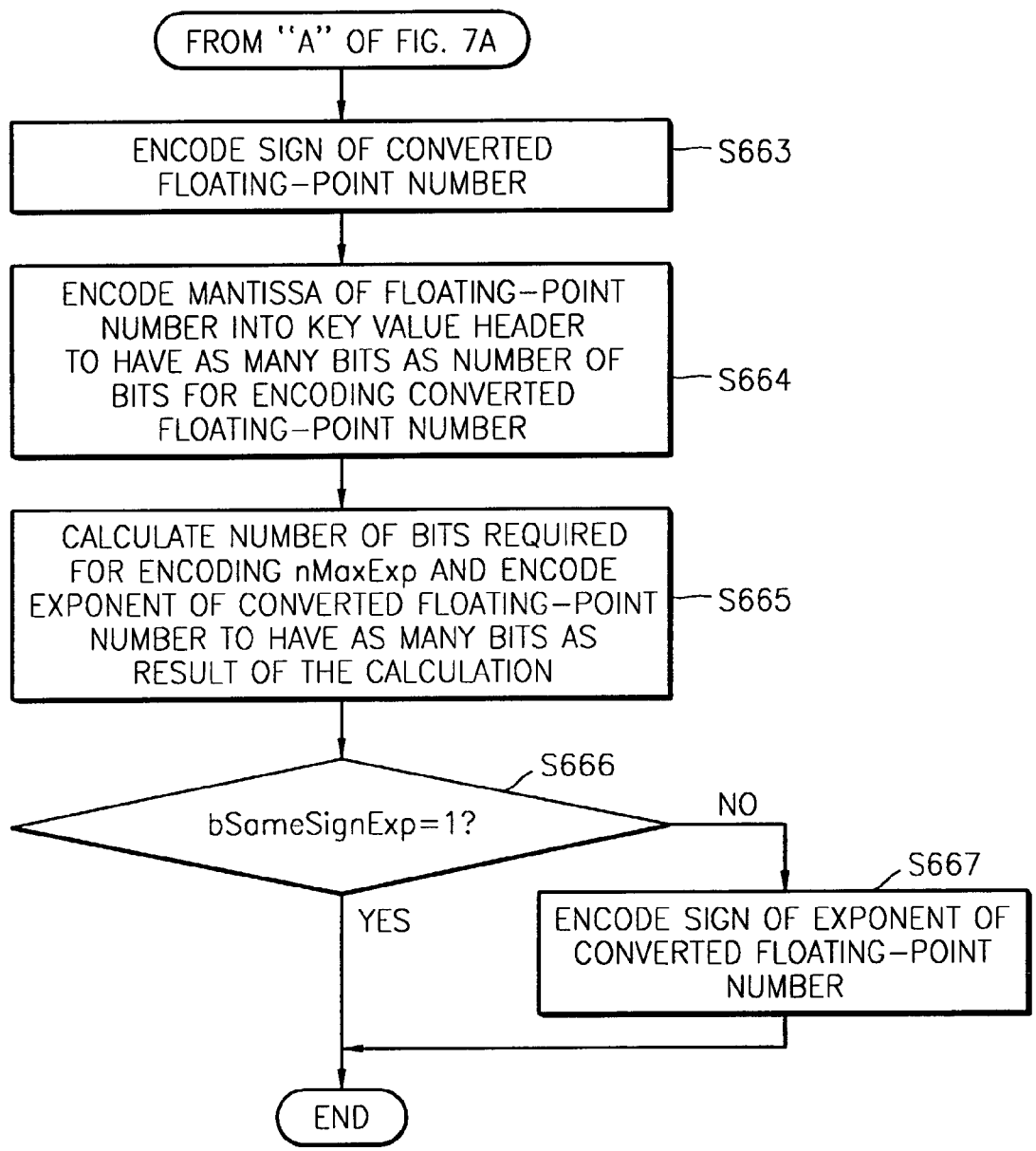

Referring to FIG. 7B, the floating-point number encoder 330 encodes the sign of the converted floating-point number in step S663 before encoding x_min, y_min, z_min, and max into a key value header.

Next, the floating-point number encoder 330 calculates the number of bits required for encoding the floating-point number referring to Table 2 and outputs the mantissa of the floating-point number, having as many bits as the result of the calculation, to the key value header encoder 360 in step S664.

The floating-point number encoder 330 calculates the number of bits required for encoding nMaxExp referring to Table 2 and outputs the exponent of the floating-point number having as many bits as the result of the calculation, to the key value header encoder 360 in step S665.

The floating-point number encoder 330 checks based on bSameSignExp if exponents of x_min, y_min, z_min, and max have the same sign. If they do not have the same sign, their signs are output to the key value header encoder 360 and are encoded in step S667, thus completing the process of encoding the maximum and minimum values among the key data of each of the x, y, and z components input from the normalizer 300.

The floating-point number encoder 330 receives the maximum and minimum values required for minimizing a quantization error from the quantization error minimizer 320 and encodes them into the key header through the above-described steps.

Referring to FIG. 6B again, the DPCM processor 340 performs a circular DPCM operation and a predictive-circular DPCM operation on the quantized key value data and outputs differential data to the entropy encoder 350 in step S670. The DPCM processor 340 is constituted by the aforementioned DPCM operator, and the operation and structure of the DPCM operator have been described above. The only difference between the DPCM processor 340 and the aforementioned DPCM operator is that the DPCM processor 340 performs a circular DPCM operation and a predictive-circular DPCM operation on the key value data of each of the x, y, and z components, separately.

The differential data output from the DPCM processor 340 are entropy-encoded in the entropy encoder 350 in step S680.

Figure 7C:
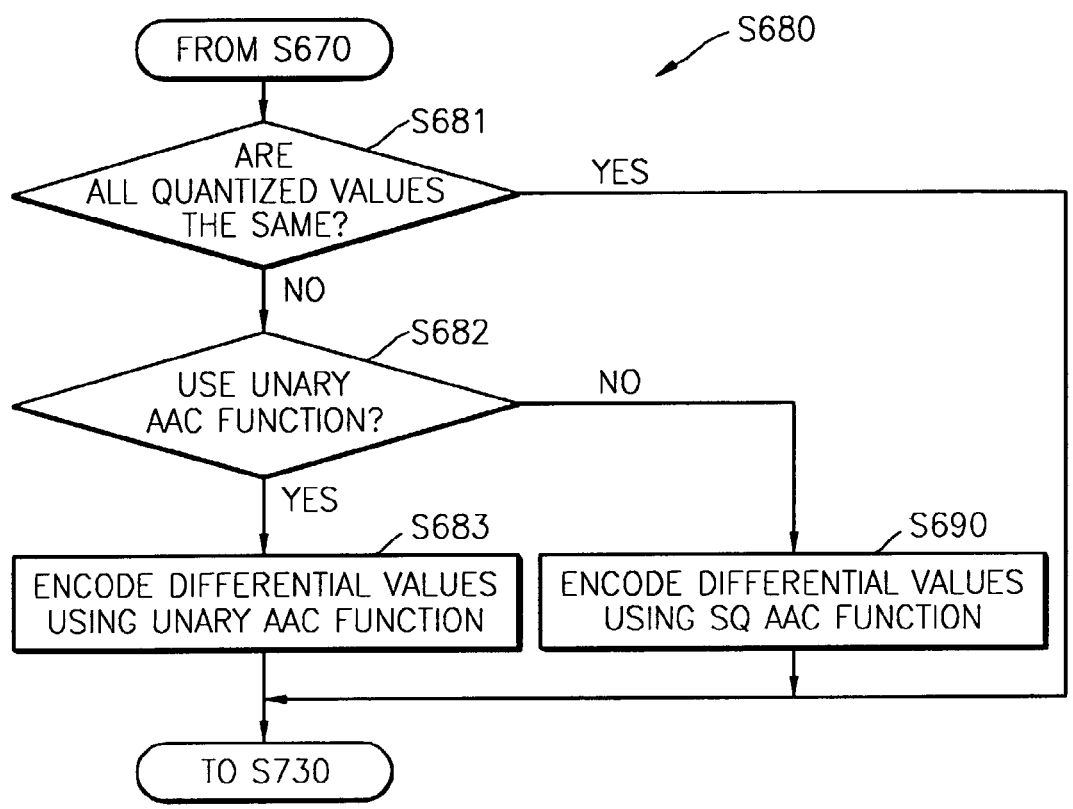
FIGS. 7C and 7D are flowcharts of the operation of an entropy decoder according to a preferred embodiment of the present invention.

Referring to FIG. 7C, the entropy encoder 350 entropy-encodes the differential data of the key value data of each of the x, y, and z components.

The entropy encoder 350 checks referring to the differential data of each of the x, y, and z components if the quantized values of the x, y, and z components are the same and completes the entropy-encoding in step S681 if they are the same. For example, in a case where in a three-dimensional animation, a train moves in a horizontal direction which is the same as the direction of the x component, the key value data of the x component vary. However, there is little change in the y and z components. Accordingly, if the y and z components are quantized, they are supposed to have the same value. Accordingly, there is no need to encode all key value data which are practically the same, and thus it is possible to enhance the efficiency of encoding by encoding only one of the key value data into a key value header.

If the quantized key value data of each of the x, y, and z components are not the same, the entropy encoder 350 reads a predetermined value which has been set up in advance, in step S682. Thereafter, the entropy encoder 350 encodes the differential data of the quantized key value data of each of the x, y, and z components using a unary AAC function in step S683 or encodes them using a successive quantization AAC function in step S685.

Figure 8:
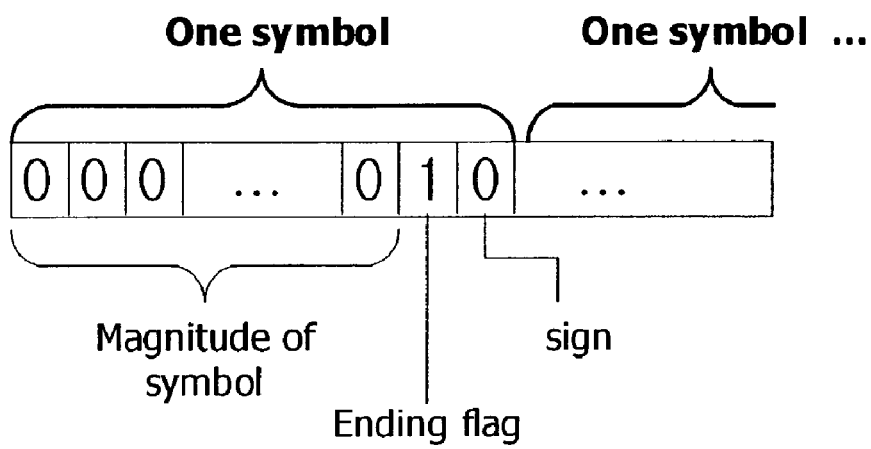
FIG. 8 is a diagram illustrating step S683 shown in FIG. 7C.

Hereinafter, the unary AAC function will be described with reference to FIG. 8. The unary AAC function converts symbols to be encoded into several bits which consist of a series of 0s, a flag bit 1 indicating that the series of zeros end, and one bit representing the sign of the symbol. Here, the series of zeros corresponds to the magnitude of the symbol. For example, 256 is encoded using the unary AAC function into a series of bits consisting of two hundred fifty six 0s, 1 which is a flag bit indicating the series of 0s ends, and 0 which represents the sign of 256, i.e., a plus sign. Due to the unary AAC function, the redundancy of the bits representing the symbol to be encoded increases, which enhances the efficiency of encoding the symbol.

Figure 7D:
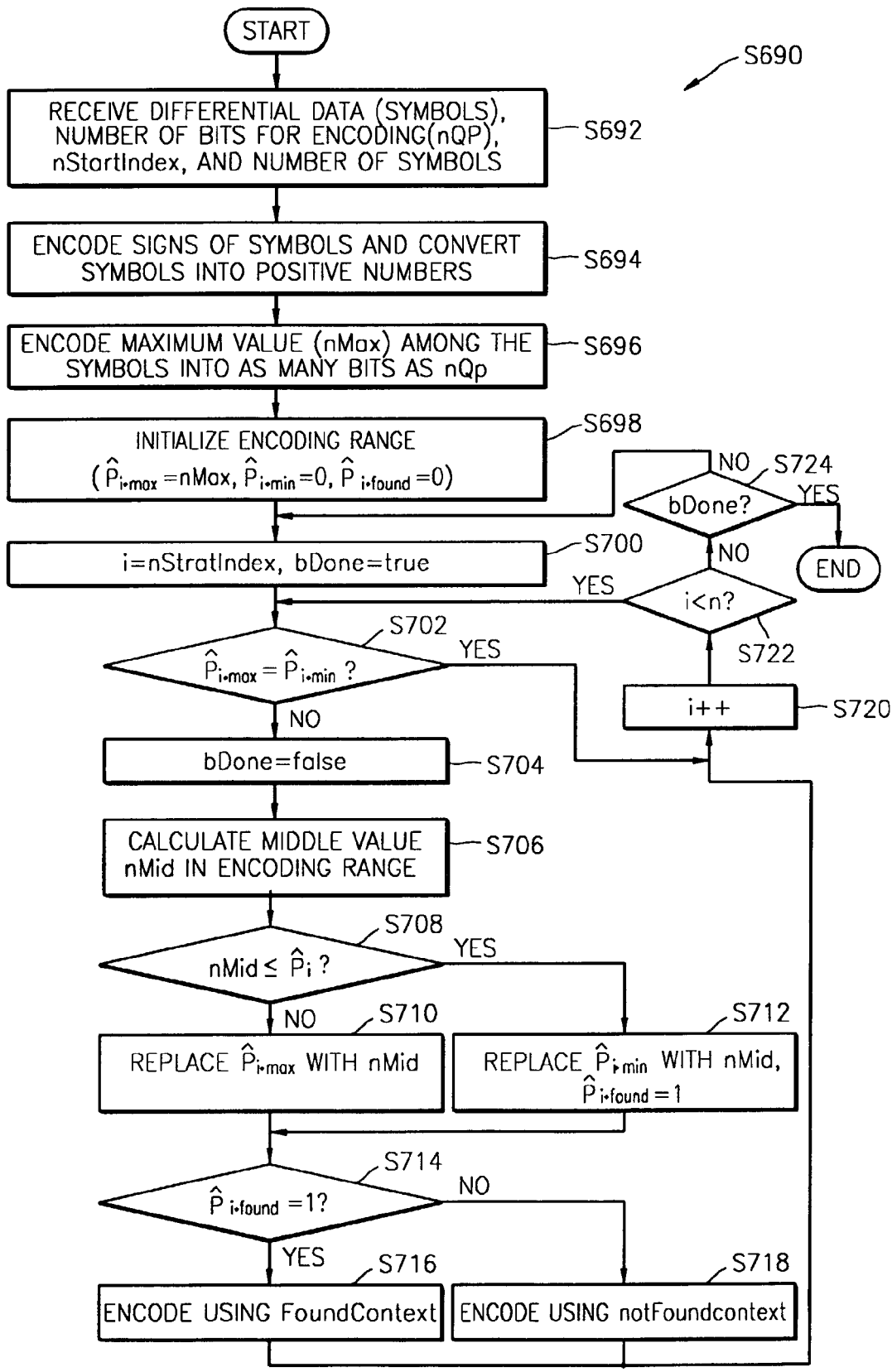
Figure 9A:
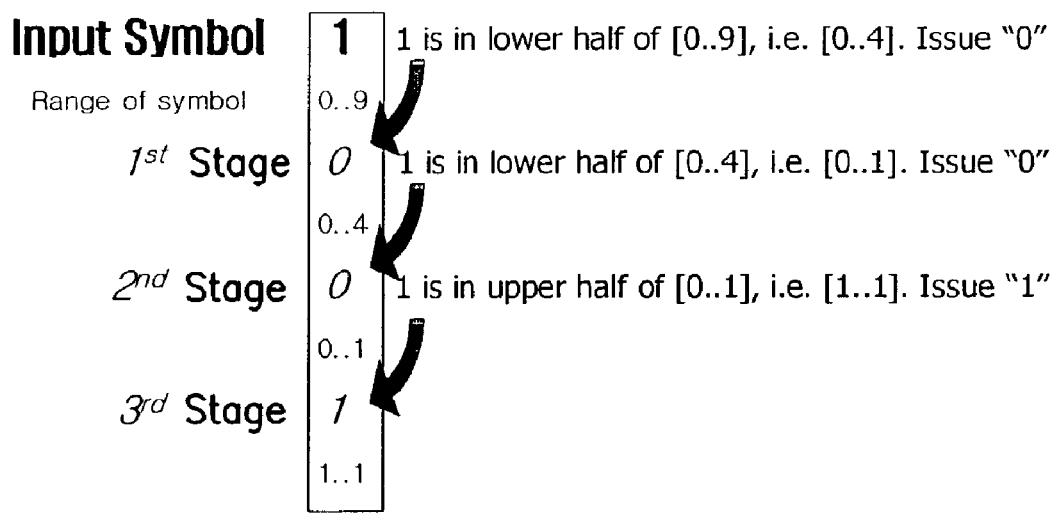
FIGS. 9A and 9B are diagrams illustrating the steps shown in FIG. 7D.
Figure 9B:
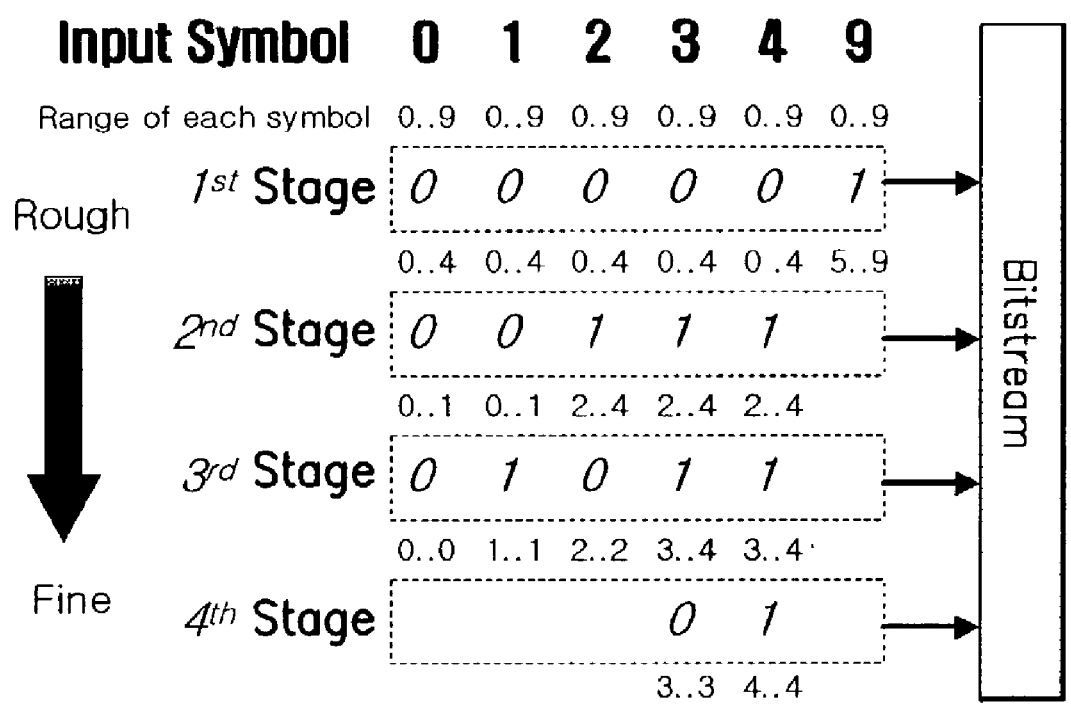

Referring to FIGS. 7D, 9A, and 9B, a method of encoding symbols using the SQ AAC function will be described. The SQ AAC function encodes symbols continuously renewing a quantization range.

FIG. 9A is a diagram illustrating a method of encoding symbols using the SQ AAC function. As shown in FIG. 9A, an input symbol to be encoded is 1, and a minimum value and a maximum value in an encoding range are 0 and 9, respectively.

Referring to FIG. 9A, in a first step of encoding the symbol, the encoding range is divided into two sub-ranges, i.e., an upper range and a lower range, and then it is checked whether the symbol to be encoded, i.e., 1, belongs to the upper range or the lower range. Since 1 belongs to the lower range, 0 is encoded and the lower range is renewed into a new encoding range. Accordingly, the new encoding range for the second step is from 0 to 4.

In the second step, the new encoding range of 0-4 is divided into two sub-ranges, i.e., an upper range and a lower range, and then it is checked whether 1 belongs to the upper range or the lower range. Since 1 belongs to the lower range, 0 is encoded, and the maximum value in the encoding range is renewed into 1 which is the maximum value in the lower range. Accordingly, a new encoding range for the third step, which used to be the lower range, is from 0 to 1.

In the third step, the encoding range of 0-1 is divided into an upper value and a lower value, and then it is checked whether 1 belongs to an upper range. Since 1 is equal to the upper value, 1 is encoded and then the minimum value in the corresponding encoding range is renewed into 1. Accordingly, a new encoding range is [1, 1] so that its maximum and minimum values are the same. When minimum and maximum values in an encoding range are the same, the encoding process using the SQ AAC function is completed.

FIG. 7D is a flowchart of a process of encoding differential data of key value data of a component using the SQ AAC function, which is performed in the entropy encoder 350 according to the present invention.

Referring to FIG. 7D, the entropy encoder 350 receives differential data (hereinafter, referred to as symbols) of key value data, the number nQP of bits required for entropy-encoding the symbols, nStartIndex indicating the first index of symbols to be encoded into a bitstream, and the number (n) of symbols to be encoded in step S692.

The entropy encoder 350 encodes the signs of the symbols and converts the symbols into positive numbers in step S694. The reason the symbols are converted into positive numbers is that negative numbers are not allowed in subsequent processes.

The entropy encoder 350 identifies a maximum value among the positive numbers, stores the maximum value as nMax, and encodes nMax into as many bits as nQP in step S696.

The entropy encoder 350 initializes a range within which the symbols will be encoded and sets a minimum value $\hat{P}_{i\text{-}min}$ and a maximum value $\hat{P}_{i\text{-}max}$ in the encoding range to 0 and nMax, respectively. In addition, the entropy encoder 350 allots a one-bit flag $\hat{P}_{i\text{-}found}$ to each of the symbols. The flag $\hat{P}_{i\text{-}found}$ found is used for changing probability models during encoding the symbols. The flag $\hat{P}_{i\text{-}found}$ is set as 'false' at the beginning and is converted into 'true' when a value to be encoded next is 1, and thereafter, the probability model having been used for encoding the symbols so far is replaced by another.

Next, the entropy encoder 350 identifies a differential datum (i=nStartIndex) of each of the x, y, and z components, which is supposed to be encoded first, and sets a flag bDone, which indicates whether or not encoding all the symbols is completed, as 'true' in step S700.

The entropy encoder 350 repeatedly performs steps S702 through S718, which will be described in the following, until maximum and minimum values in an encoding range for each of the symbols become the same, i.e., until there is no symbol left to be encoded. Here, when maximum and minimum values in an encoding range for a symbol are the same, it is considered that encoding of the symbol is completed.

The entropy encoder 350 checks if $\hat{P}_{i\text{-}max}$ is equal to $\hat{P}_{i\text{-}min}$ in step S702. If $\hat{P}_{i\text{-}max}$ is equal to $\hat{P}_{i\text{-}min}$, the method moves on to a step for encoding the next symbol, and if not, bDone is set as 'false', which means the encoding of the current symbol (the symbol currently being encoded) is not completed yet, in step S704.

The entropy encoder 350 calculates a middle value nMid in the encoding range for the current symbol in step S706 and compares the middle value nMid with the value of the current symbol in step S708. In a preferred embodiment of the present invention, the middle value nMid is calculated using the following equation.

$$nMid = \frac{\hat{P}_{i\cdot max} + \hat{P}_{i\cdot min}}{2} + \hat{P}_{i\cdot min} + 1 \qquad (10)$$

As a result of the comparison, if the current symbol value is not greater than the middle value nMid, which means that the current symbol belongs to the upper range, then 0 is issued to a bitstream and the maximum range $\hat{P}_{i\cdot max}$ in the encoding range for the current symbol is replaced by the middle value nMid in step S710.

On the other hand, if the current symbol value is greater than the middle value nMid, which means that the current symbol belongs to the upper range, then 1 is issued to the bitstream and the minimum value $\hat{P}_{i\cdot min}$ in the encoding range for the current symbol is replaced by the middle value nMid. When the value of the symbol currently being encoded exceeds the middle value nMid for the first time, in other words, when 1 is issued to the bitstream for the first time, $\hat{P}_{i\cdot found}$ is set as 'true' in step S712 so as to change the probability model for encoding the symbols.

There are two probability models used in the SQ AAC function. One is notFoundContext for entropy-encoding bits output before 1 is issued from each of the symbols for the first time, and the other is FoundContext for entropy-encoding bits output right after 1 is issued from each of the symbols for the first time. The purpose of using two different probability models is to increase the probability of 0 being generated during using notFoundContext. As the probability of 0 being generated increases, the efficiency of entropy-encoding a symbol increases.

Thereafter, the entropy encoder 350 checks if $\hat{P}_{i\cdot found}$ is true or false in step S714. If $\hat{P}_{i\cdot found}$ is true, the entropy encoder 350 encodes the symbols using FoundContext in step S716, and if not, the entropy encoder 350 encodes the symbols using notFoundContext in step S718.

When the process of encoding the current symbol ranging from step S702 to step S718 is completed, which means the entropy encoder completes the encoding of the current symbol in only one stage, the entropy encoder 350 increases an encoding index i by 1 in step S720. Next, the entropy 350 checks whether or not all the symbols are completely encoded in the current stage in step S722. If there are symbols left to be encoded in the current stage, the entropy encoder 350 performs steps S702 through S722 again.

When all the symbols in one stage are completely encoded, the entropy encoder 350 checks based on the flag bDone if the encoding of all stages is completed, in step S724. If bDone is true, the entropy encoder 350 completes the whole encoding process in the current stage and starts to encode the next component, and if not, the entropy encoder 350 performs steps S700 through S722 again to encode the remaining symbols.

FIG. 9B is a diagram illustrating a process of encoding a plurality of symbols using the SQ AAC function. Specifically, FIG. 9B shows a process of encoding 0, 1, 2, 3, 4, and 9 using the SQ AAC function.

Referring to FIG. 6B again, if the apparatus for encoding data according to the present invention generates a bitstream by entropy-encoding all input key value data, the key value header encoder 360 encodes information required for decoding the encoded key value data into key value header information, adds the key value header information to the bitstream, and outputs the resulting bitstream in step S730.

The key value header encoder 360 encodes the number and digit number of input key value data to be encoded and the quantization bit size of the key value data. Next, the key value header encoder 360 identifies if each of the x, y, and z components has the same quantized values (for example, even though the key value data of each of the x, y, and z components vary, the quantized key value data of the x components have the same value because the degree to which the key value data of the x component vary is very small) and encodes the result into a flag.

For example, if the quantized values of the x component are not the same, whether a circular DPCM operation or a predictive-circular DPCM operation has been used to encode the key value data of the x component and whether the key value data of the x component will be encoded using the unary AAC function or the SQ AAC function are encoded into flags. If the key value data of the x component is not expected to be encoded using the unary AAC function, the encoding bit size of the x component and the start index of x component to be entropy-encoded is encoded into a key value header.

Likewise, if the key value data of each of the y and z components are not the same, header information of the y and z components, which exactly corresponds to the aforementioned header information of the x component is encoded into a header.

If the quantized values of the x component are not the same, the unary AAC function is not used to encode the key value data of the x component, and the start index of x component to be entropy-encoded is 1, then the first quantized key value datum is encoded as an intra datum. In the same manner, the first quantized key value datum of each of the y and z components is encoded as an intra datum.

The key value header encoder 360 identifies which component among the x, y, and z components has a maximum range. If the x component has a maximum range, the key value header encoder 360 sets up a variable nWhichAxis at 0. If the component y has a maximum range, the key value header encoder 360 sets up nWhichAxis at 1. If the component z has a maximum range, the key value header encoder 360 sets up nWhichAxis at 2. Thereafter, the key value header encoder 360 encodes nWhichAxis, x_min, y_min, z_min, and max into a key header using the floating-point number encoder 330.

Hereinafter, an example of computer programs into which a method for encoding data according to a fourth embodiment of the present invention is realized will be described.

The apparatus for encoding data according to the present invention encodes a position interpolator into a bitstream, which will be described in the following. For better understanding, conventional program codes and variables will be described in the following in the form of SDL language.

FIG. 19 shows an example of program codes into which a compressed position interpolator is realized. In FIG. 19, a top class for reading a bitstream of a compressed position interpolator is shown. The first class includes PosIKeyValueHeader and PosIKeyValue. PosIKeyValueHeader includes header information for decoding PosIKeyValue, and class PosIKeyValue reads key value data regarding the compressed position interpolator from the bitstream. A function qf_start( ) is used to initialize an arithmetic decoder before reading part of the bitstream which is AAC-encoded.

FIG. 20 shows program codes of PosIKeyValueHeader. Referring to FIG. 20, among variables stored in PosIKeyValueHeader, nNumKeyValueCodingBit represents the bit size of nNumberOfKeyValue, nNumberOfKeyValue represents the number of key value data, and nKVQBit represents the quantization bit size of the key value data.

x_keyvalue_flag, y_keyvalue_flag, and z_keyvalue_flag indicate if the x, y, and z components has the same quantized value and nKVDigit represents a maximum number of most significant digits of each of the key value data. nKVDPCMOrder_X, nKVDPCMOrder_Y, and nKVDPCMOrder_Z correspond to the order of DPCM used for the key value data of each of the x, y, and z components, respectively. If DPCM has been performed, a flag is set to 0, and if predictive DPCM has been performed, the flag is set to 1.

bIsUnaryAAC_X, bIsUnaryAAC_Y, and bIsUnaryAAC_Z each indicate that an unary AAC function has been used during entropy-encoding. nKVCodingBit_X, nKVCodingBit_Y, and nKVCodingBit_Z indicate the encoding bit size for the x, y, and z components, respectively. nStartIndex_X, nStartIndex_Y, and nStartIndex_Z represent the start index of each component axis to be encoded. firstKV_X, firstKV_Y, and firstKV_Z represent a first quantized key value datum of each of the x, y, and z components, respectively, which are encoded as intra data.

FIG. 21 shows program codes of class KeyValueMinMax. Referring to FIG. 21, class KeyValueMin retrieves the maximum and minimum values that have been used for normalization of key value data. bUse32float indicates whether or not a 32-bit floating-point number has been used to store the maximum and minimum values. If bUse32Float is 0, the maximum and minimum values for normalization of key value data are encoded using IEEE Standard 754 floating-point number format. If not, the maximum and minimum values for normalization of key value data are encoded using the floating-point number encoder.

nWhichAxis represents a component having a maximum range among the x, y, and z components. In the present embodiment, if nWhichAxis is 0, the X-axis has a maximum range, if nWhichAxis is 1, the Y-axis has a maximum range, and if nWhichAxis is 2, the Z-axis has a maximum range.

bAllSameMantissaDigitFlag indicates whether or not the mantissas of minimum values among the key value data of each of the x, y, and z components have the same digit number, and bSameKVDigitFlag represents the digit number of the mantissas of the minimum values is the same as nKVDigit. nMantissaDigit_X, nMantissaDigit_Y, and nMantissaDigit_Z represent the digit number of the mantissas of the minimum values among the key value data of each of the x, y, and z components, respectively.

bMaxDigitFlag indicates whether or not the mantissa of a maximum value has the same digit number as a minimum value of component, from which the maximum value max comes. If the digit number of the mantissa of the maximum value is different from the digit number of the mantissa of the minimum value, the digit number of the mantissa of the maximum value is read from the bitstream.

nMantissaDigit_M represents the digit number of the mantissa of the maximum value, and nExponentBits represents the number of bits required for encoding the maximum absolute exponent among the exponent of the maximum and minimum values. bAllSameExponentSign indicates whether or not the signs of the x, y, and z components are the same, and nExponentSign represents the sign of an exponent when bAllSameExponentSign is true.

fpnMin_X, fpnMin_Y, fpnMin_Z, and fpnMax represent floating-point numbers in the decimal system which are decoded. A method of decoding fpnMin_X, fpnMin_Y, fpmMin_Z, and fpnMax will be described later with FloatingPointNumber. fMin_X, fMin_Y, and fMin_Z represent a minimum value among the key value of each of the x, y, and z components, and fMax represents a maximum value among the key value data of the component having the maximum range.

Program codes of class FloatingPointNumber will be described in the following with reference to FIG. 22. Class FloatingPointNumber expresses floating-point numbers using the decimal system. nMantissa represents the mantissa of a floating-point number in the decimal system, and nExponent represents the exponent of the floating-point number.

nSign represents the sign of a floating-point number, and nExponentSign represents the sign of the exponent of the floating-point number.

Program codes of class PosIKeyValue will be described in the following with reference to FIG. 23. Referring to FIG. 23, among variables stored in class PosIKeyValue, keyvalue_X, keyValue_Y, and keyValue_Z represent an array of the key value data of each of the x, y, and z components, respectively, in a position interpolator. If nStartIndex_X is set to 0, keyValue_X[0] is decoded from a bitstream using an arithmetic decoder. If nStartIndex_X is set to 1, keyValue_X[0] is decoded from the key value header decoder. In the same manner, keyValue_Y[0] and keyValue_Z[0] are determined. When arithmetically decoding keyValue_X[0], keyValue_Y[0], and keyValue_Z[0] from the bitstream, a decodeUnaryAAC or decodeSQAAC function is used.

Context models kVXSignContext, kVYSignContext, and kVZSignContext are used to decode the signs of keyValue_X, keyValue_Y, and keyValue_Z, respectively. The context models kVXSignContext, kVYSignContext, and kVZSignContext are transmitted to the decodeUnaryAAC or decodeSQAAC function.

MaxValueContext, FoundContext, and NotFoundContext are used to entropy-decode the absolute values of key values. For example, kVXMaxValueContext, kVXFoundContext, and kVXNotFoundContext are used to decode keyValue_X. MaxValueContext, FoundContext, and NotFoundContext are transmitted to the decodeUnaryAAC or decodeSQAAC function.

Context models kVXUContext, kVYUContext, and kVZUContext are used to decode keyValue_X, keyValue_Y, and keyValue_Z and are transmitted to the decodeUnaryAAC function.

Hereinafter, an inverse DPCM operator, which outputs quantized data by restoring differential data generated by the aforementioned DPCM operator, will be described with reference to FIGS. 10A and 10B.

Figure 10A:
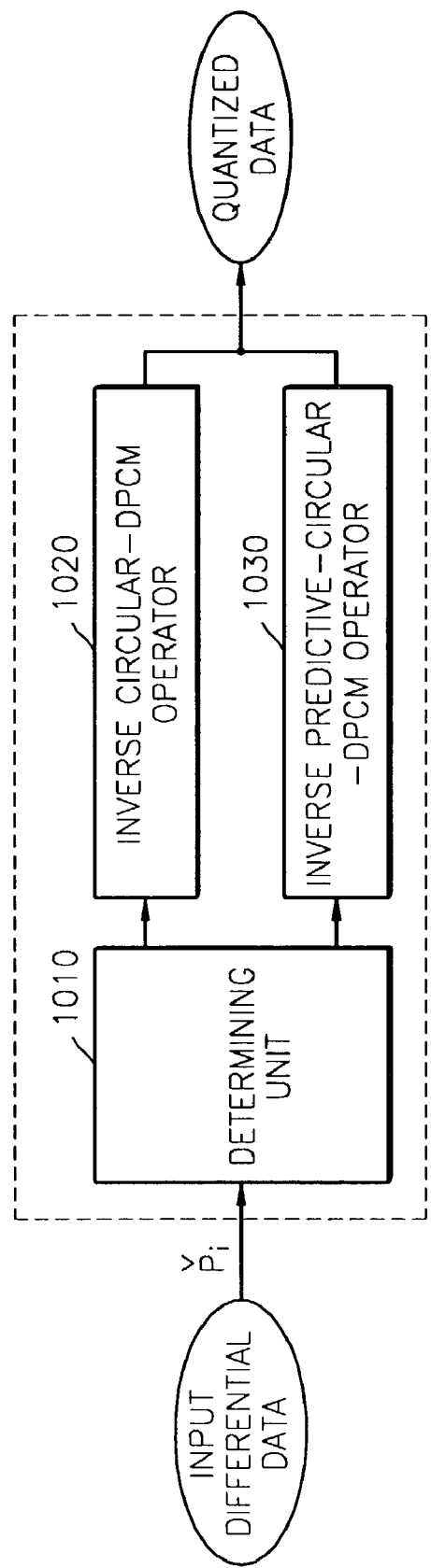
FIG. 10A is a block diagram of an inverse DPCM operator according to a preferred embodiment of the present invention.
Figure 10B:
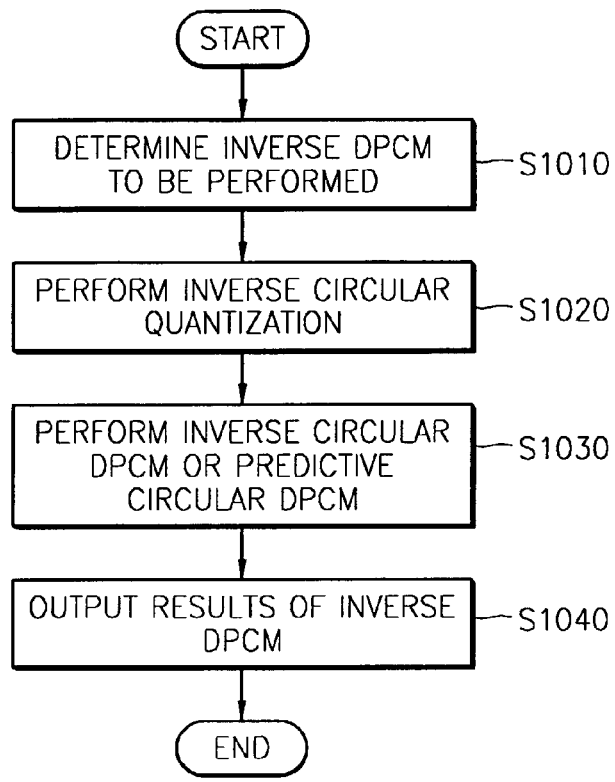
FIG. 10B is a flowchart of an inverse DPCM operation.

FIG. 10A is a block diagram of an inverse DPCM operator according to the present invention, and FIG. 10B is a flowchart of an inverse DPCM operation.

Referring to FIG. 10A, an inverse DPCM operator according to the present invention includes an inverse circular DPCM operator 1020, which performs an inverse circular quantization operation on differential data input thereinto so as to extend their range, performs an inverse DPCM operation on the input differential data, and then outputs quantized data, an inverse predictive-circular DPCM operator 1030 which performs an inverse circular quantization operation on differential data input thereinto so as to extend their range, performs an inverse predictive DPCM operation on the input differential data, and then outputs quantized data, and a determining unit 1010 which outputs differential data to either the inverse circular DPCM operator 1020 or the inverse predictive-circular DPCM operator 1030 depending on the kind of DPCM that has been performed on the differential data.

An inverse DPCM operation will be described in the following with reference to FIG. 10B. Referring to FIGS. 10A and 10B, differential data subjected to an inverse DPCM operation are input into the determining unit 1010. Then the determining unit 1010 identifies what kind of DPCM has been performed on the input differential data, determines what kind of inverse DPCM will be performed on the input differential data based on the result, and outputs the differential data to either the inverse circular DPCM operator 1020 or the inverse predictive-circular DPCM operator 1030 in step S1010.

If the differential data are input into the inverse circular DPCM operator 1020 and nMax is a maximum value in a quantization range of the input differential data, the inverse circular DPCM operator 1020 obtains quantized differential data $\check{P}'_i$ in step S1020 by performing inverse circular quantization on the input differential data $\check{P}_i$, which is shown in the following equation.

$$\check{P}'_i = \check{P}_i - (n\text{Max}+1) \text{ (if } \check{P}_i \geq 0) \quad (11)$$

$$\check{P}'_i = \check{P}_i - (n\text{Max}+1) \text{ (if } \check{P}_i < 0)$$

Thereafter, the inverse circular DPCM operator 1020 obtains a value A of an inverse-DPCMed differential datum and a value B of an inverse-DPCMed differential datum by substituting input differential data $\check{P}_i$ and inversely circular-quantized differential data $\check{P}'_i$, respectively, obtained from Equation (11) into Equation (12).

$$A = \check{P}_i + \check{P}_{i-1} \quad (12)$$

$$B = \check{P}'_i + \check{P}_{i-1}$$

In Equation (12), n represents the number of data, and i represents an integer between 1 and n−1.

If A is not smaller than 0 and not greater than nMax, the inverse circular DPCM operator 1020 outputs A as inverse circular-DPCMed data $\check{P}_i$. If A is smaller than 0 or greater than nMax, the inverse circular DPCM operator 1020 outputs B in step S1040.

The inverse predictive-circular DPCM operator 1030 obtains the inversely circular-quantized predicted differential data $\check{P}'_i$ in step S1020 by performing inverse circular quantization on the predicted differential data $\check{P}_i$ using Equation (11).

If $P = 2 \times \check{P}_{i-1} + \check{P}_{i-2}$ where P represents predicted data used for decoding, the inverse circular DPCM operator 1030 calculates A by substituting $\check{P}_i$ into Equation (13) and calculates B by substituting $\check{P}'_i$ into Equation (14).

$$A = n\text{Max} - \check{P}_i \text{ (if } P > n\text{Max)} \quad (13)$$

$$A = \check{P}_i \text{ (if } P < 0)$$

$$A = \check{P}_i + P \text{ (otherwise)}$$

$$B = n\text{Max} - \check{P}'_i \text{ (if } P > n\text{Max)} \quad (14)$$

$$B = \check{P}'_i \text{ (if } P < 0)$$

$$B = \check{P}'_i + P \text{ (otherwise)}$$

In Equations (13) and (14), n represents the number of data and i is an integer between 1 and n−1.

If A is not smaller than 0 and not greater than nMax, the inverse circular DPCM operator 1020 outputs A as the inversely predictive-circular-DPCMed data $\tilde{P}_i$. If A is smaller than 0 or greater than nMax, the inverse predictive-circular DPCM operator 1020 outputs B as $\tilde{P}_i$ in step S1040.

Hereinafter, an apparatus for decoding data according to a first embodiment of the present invention will be described with reference to FIG. 11. The apparatus for decoding data according to the first embodiment of the present invention decodes a bitstream, into which input data have been encoded using the apparatus for encoding data according to the first embodiment of the present invention, using the DPCM operator according to the present invention.

Figure 11:
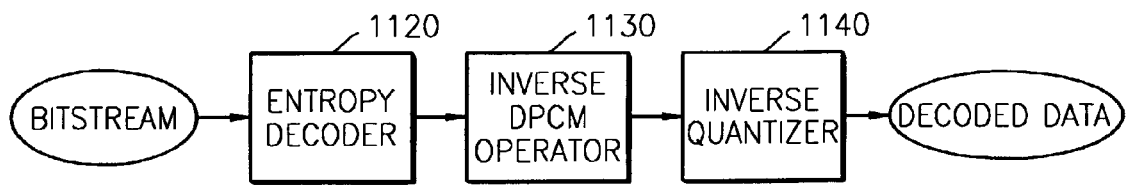
FIG. 11 is a block diagram of an apparatus for decoding data using an inverse DPCM operator according to a preferred embodiment of the present invention.

Referring to FIG. 11, the apparatus for decoding data according to the first embodiment of the present invention includes an entropy decoder 1120, an inverse DPCM processor 1130, which is constituted by the aforementioned inverse DPCM operator, and an inverse quantizer 1140.

The entropy decoder 1120 generates differential data by entropy-decoding an input bitstream and outputs the differential data to the inverse DPCM processor 1130.

The inverse DPCM processor 1130, as described above, identifies what kind of DPCM has been performed on the input differential data, performs an inverse circular DPCM operation or an inverse predictive-circular DPCM operation on the differential data, and outputs quantized data to the inverse quantizer 1140.

The inverse quantizer 1140 inversely quantizes the quantized data input from the inverse DPCM processor 1130 with predetermined quantization bits and outputs retrieved data.

Figure 12B:
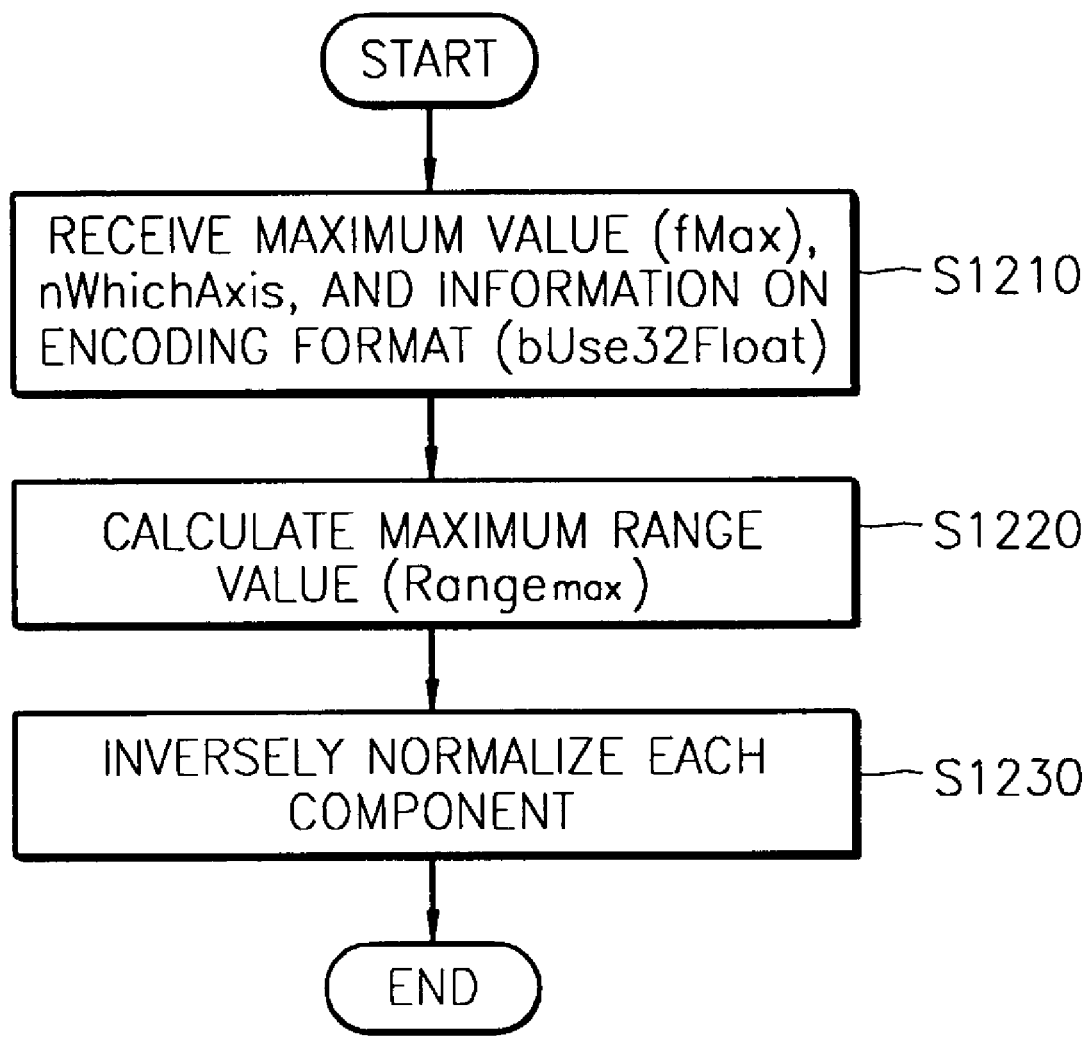
FIG. 12B is a flowchart of the operation of an inverse normalizer.

Hereinafter, an apparatus for decoding data according to a second embodiment of the present invention will be described with reference to FIGS. 12A and 12B. The apparatus for decoding data according to the second embodiment of the present invention decodes a bitstream, into which data having a plurality of components that have been normalized by the normalizer according to the present invention are encoded.

Referring to FIG. 12A, the apparatus for decoding data according to the second embodiment of the present invention includes an entropy decoder 1120 which entropy-decodes an input bitstream and thus outputs differential data, an inverse DPCM operator 140/1130 which performs an inverse DPCM operation on the differential data input from the entropy decoder 1120 and outputs quantized data, an inverse quantizer 1140 which inversely quantizes the quantized data input from the inverse DPCM operator 140/1130 and outputs normalized data, and an inverse normalizer 1150 which receives minimum among key value data of each component and a maximum value of a component having the maximum range, calculates a maximum range of normalized data, and inversely normalizes the quantized data input from the inverse quantizer 1140 based on the maximum range.

The operations and structures of the entropy decoder 1120, the inverse DPCM operator 140/1130, and the inverse quantizer 1140 are the same as the operations and structures of the corresponding elements of the apparatus for decoding data according to the first embodiment of the present invention, and thus their description will not be repeated here. The operation of the inverse normalizer 1150 will be described in the following with reference to FIG. 12B.

The inverse normalizer 1150 receives the maximum value fMax used for normalization, which is decoded from the input bitstream, the minimum values fMin_X, fMin_Y, and fMin_Z of the x, y, and z components, respectively, the information nWhichAxis on which component axis has a maximum value, and the information bUse32Float on the type of encoding in step S1210.

The inverse normalizer 1150 identifies based on bUse32Float whether or not fMax, fMin_X, fMin_Y, and fMin_Z are encoded with IEEE Standard 754 floating-point number format, and if they are not, the inverse normalizer 1150 calculates a maximum value Range$_{max}$ in a maximum range using the following equations. If fMax, fMin_X, fMin_Y, and fMin_Z are encoded with 32 bits, the inverse normalizer 1150 determines fMax as Range$_{max}$ in step S1220.

$$\text{Range}_{max} = f\text{Max} - f\text{Min\_X} \text{ (if } n\text{WhichAxis}=0) \quad (15)$$

$$\text{Range}_{max} = f\text{Max} - f\text{Min\_Y} \text{ (if } n\text{WhichAxis}=1)$$

$$\text{Range}_{max} = f\text{Max} - f\text{Min\_Z} \text{ (if } n\text{WhichAxis}=2)$$

If Range$_{max}$ is determined, the inverse normalizer 1150 inversely normalizes the data of each of the x, y, and z components based on Range$_{max}$ using the following equations in step S1230.

$$\hat{P}_{i,x} = \tilde{P}_{i,x} \times \text{Range}_{max} + f\text{Min\_X} \quad (16)$$

$$\hat{P}_{i,y} = \tilde{P}_{i,y} \times \text{Range}_{max} + f\text{Min\_Y}$$

$$\hat{P}_{i,z} = \tilde{P}_{i,z} \times \text{Range}_{max} + f\text{Min\_Z} \ (i=0, 1, \ldots, n)$$

In Equation (16), n represents the number of data.

Hereinafter, an apparatus and a method for decoding data according to a third embodiment of the present invention will be described with reference to FIGS. 13A and 13B. The apparatus for decoding data according to the third embodiment of the present invention decodes a bitstream, into which key value data of a position interpolator representing the location of an object in a three-dimensional animation have been encoded using the method for encoding data according to the present invention.

Figure 13A:
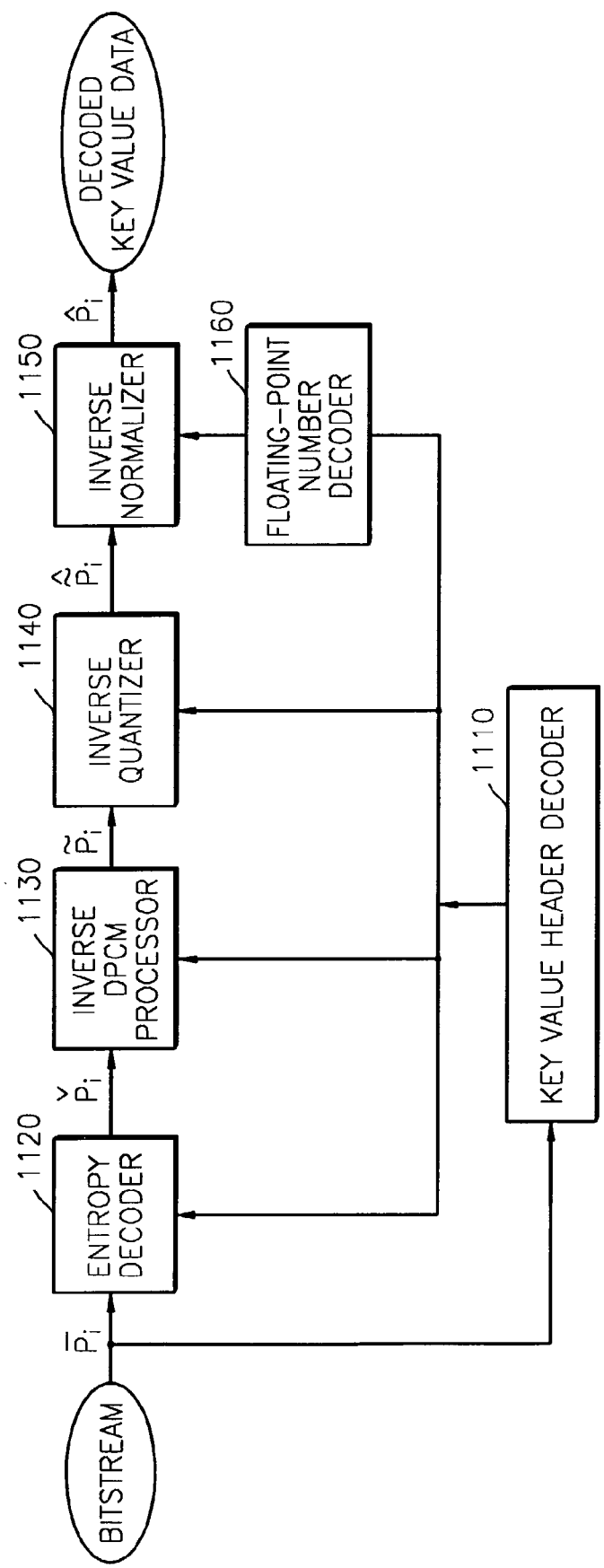
FIG. 13A is a block diagram of an apparatus for decoding key value data according to a preferred embodiment of the present invention.

Referring to FIG. 13A, the apparatus for decoding data according to the third embodiment of the present invention includes a key value header decoder 1110, which decodes information required for decoding from a bitstream, an entropy decoder 1120, which entropy decodes the bitstream input thereinto and thus outputs differential data, an inverse DPCM processor 1130, which performs an inverse circular DPCM operation or an inverse predictive-circular DPCM operation on the differential data input from the entropy decoder 1120 and thus outputs quantized key value data, an inverse quantizer 1140, which inversely quantizes the quantized key value data input from the inverse DPCM processor 1130 and thus outputs normalized key value data, a floating-point number decoder 1160, which receives minimum and maximum values from the key value header decoder 1110, converts minimum values among the key value data of each of the x, y, and z components and the maximum value of a component having the maximum range, into binary numbers, and outputs the binary numbers, and an inverse normalizer 1150, which receives the minimum values among the key value data of each of the x, y, and z components and a maximum value of a component having the maximum range, from the floating-point number decoder 1160, calculates the maximum range from the minimum values and the maximum value from the floating-point number decoder 1160 and then inversely normalizes the key value data input from the inverse quantizer 1140.

Hereinafter, a method for decoding data according to a third embodiment of the present invention will be described with reference to FIG. 13B. Referring to FIG. 13B, a bit stream of encoded key value data are input into the entropy decoder 1120 and the key value header decoder 1110. Then, the key value header decoder 1110 decodes header information required for decoding from the bitstream and outputs the decoded header information to the entropy decoder 1120, the inverse DPCM processor 1130, and the inverse quantizer 1140 in step S1300.

The entropy decoder 1120 entropy-decodes the bitstream and then outputs differential data to the inverse DPCM processor 1130 in step S1320.

Figure 14A:
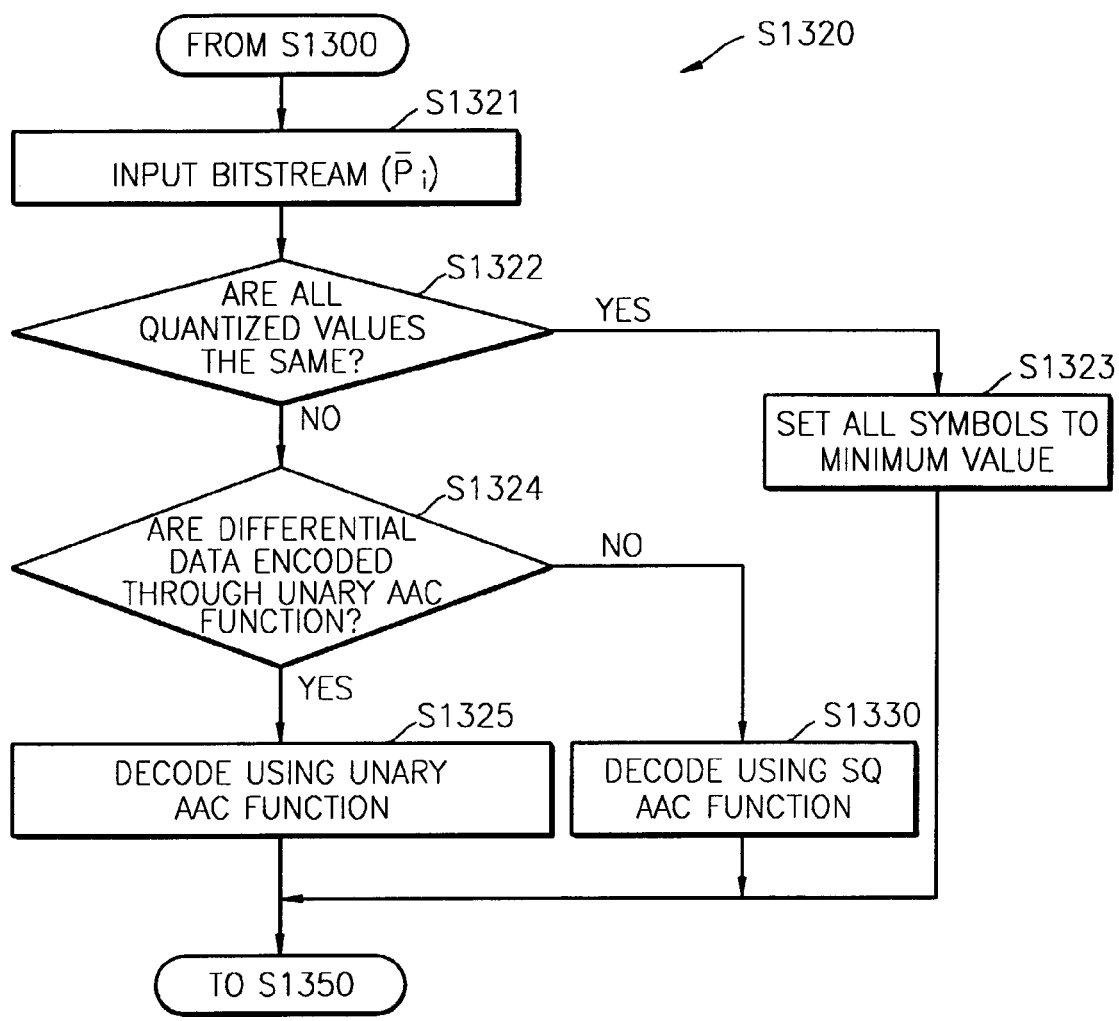
FIG. 14A is a detailed flowchart of step S1320 shown in FIG. 13B.
Figure 14B:
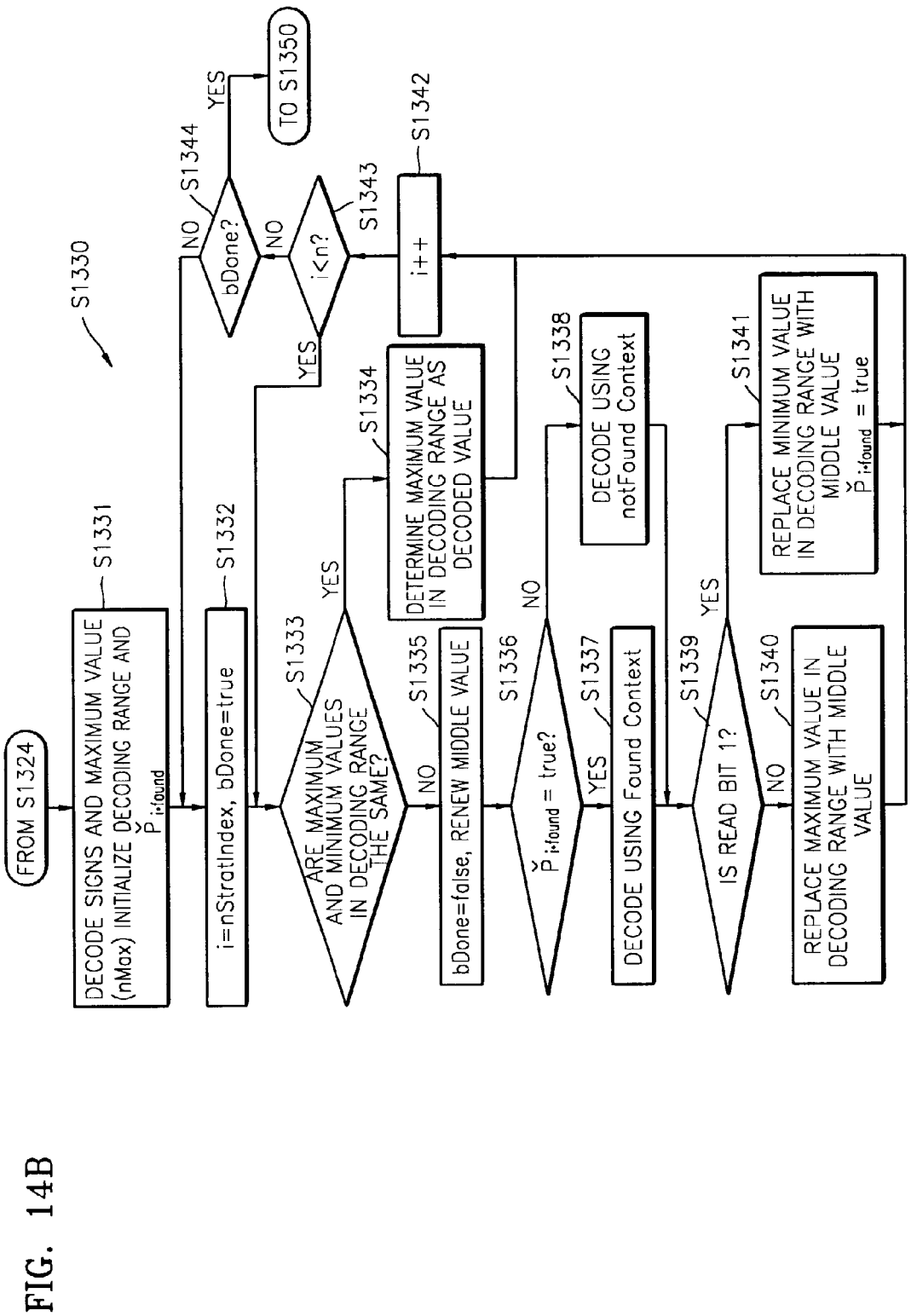
FIG. 14B is a detailed flowchart of step S1330 shown in FIG. 14A.
Figure 15:
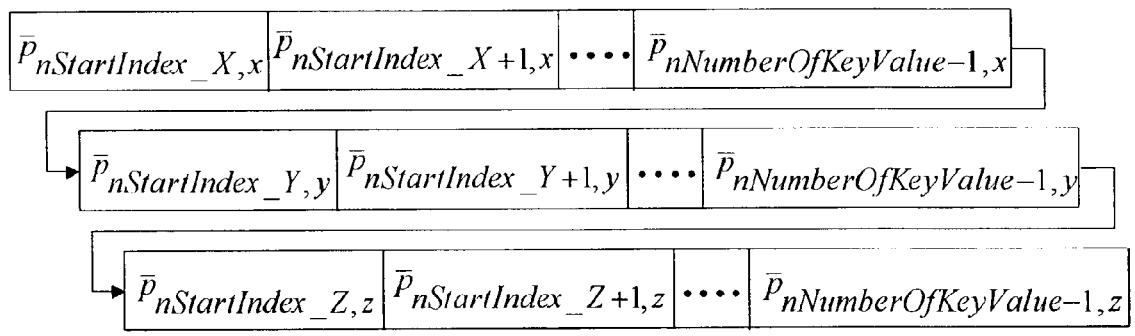
FIG. 15 is a diagram illustrating the order of components of a bitstream which is input into an entropy decoder according to a preferred embodiment of the present invention.

FIG. 14A is a detailed flowchart of step S1320. Referring to FIG. 14A, a bitstream $\overline{P}_i$ is input into the entropy decoder 1120 in step S1321. FIG. 15 is diagram showing the sequence of encoded key value data which are input into the entropy decoder 1120 and are subjected to entropy-decoding.

The entropy decoder 1120 checks if key value data of a component, for example, x, have the same quantized value in step S1322. If the key value data of the component have the same quantized value, all symbols of the component are decoded setting them as a minimum value input from the key value header decoder 1110, for example, fMin_X, in step S1323.

If the key value data of the component do not have the same quantized value, the entropy decoder 1120 checks if the key value data have been encoded using an unary AAC function, in step S1324. If the key value data have been encoded using an unary AAC function, they are decoded using the unary AAC function in step S1325.

The unary AAC function reads 0s from the bitstream until a bit "1" appears, converts the number of 0s into an absolute value, reads a bit next to the bit "1" as the sign of value if the bit is "0", the sign of value is positive, if the bit is "1", the sign of value is negative, and outputs a decoded value.

If the key value data of the component have not been encoded using the unary AAC function, the entropy decoder 1120 decodes the bitstream, into which the key value data of the component are encoded, using an SQ AAC function, which will be described in the following.

The entropy decoder 1120 decodes the signs of all the symbols from the bitstream, decodes the maximum value nMax, and initializes the decoding range of all the symbols (ranging from 0 to nMax) and the flag $\check{P}_{i\text{-}found}$ as 'false' in step S1331.

Thereafter, the entropy decoder 1120 determines a key value datum to be decoded first (i=nStartIndex) and sets bDone as 'true' in step S1332.

The entropy decoder 1120 performs steps S1333 through S1343 again to decode the symbols.

In particular, the entropy decoder 1120 checks if the maximum value $\check{P}_{i\text{-}max}$ and the minimum value $\check{P}_{i\text{-}min}$ in the decoding range are the same in step S1333.

If $\check{P}_{i\text{-}max}$ and $\check{P}_{i\text{-}min}$ are the same, the symbol to be encoded is determined as a maximum value (or a minimum value) in the decoding range in step S1334, and if not, the entropy decoder 1120 sets bDone as 'false' and renews a middle value nMid in the decoding range following Equation (17) in step S1335.

$$nMid = \frac{\check{P}_{i\text{-}max} + \check{P}_{i\text{-}min}}{2} + \check{P}_{i\text{-}min} + 1 \quad (17)$$

The entropy decoder 1120 checks if the context flag $\check{P}_{i\text{-}found}$ is true in order to determine a probability model for decoding, in step S1336. If the context flag $\check{P}_{i\text{-}found}$ is true, the entropy decoder 1120 decodes the bitstream using FoundContext in step S1337, and if not, the entropy decoder 1120 decodes the bitstream using notFoundContext in step S1338.

The entropy decoder 1120, which has decoded one bit from the bitstream, checks if the bit read from the bitstream is 1 in step S1339, and if not, the entropy decoder 1120 replaces the maximum value $\breve{P}_{i\text{-}max}$ in the decoding range with the middle value nMid in step S1340. If the bit decoded from the bitstream is 1, the entropy decoder 1120 replaces the minimum value $\breve{P}_{i\text{-}min}$ in the decoding range with the middle value nMid and sets the context flag $\breve{P}_{i\text{-}found}$ as 'true' in step S1341.

The entropy decoder 1120 increases the decoding index i by 1 in step S1342, checks if all the key value data of the component are completely decoded in the current stage in step S1343, and performs steps S1333 through S1342 if there are symbols left to be decoded in the current stage.

If all the key value data of the current stage have been decoded, the entropy decoder 1120 checks if additional stage is needed to decode key value data of the current components in step S1344 and if so, performs steps S1332 through S1343 again. The entropy decoder checks if all key value data of the current component have been decoded, the entropy decoder starts to decode the key value data of the next component.

Referring to FIGS. 13A and 13B, differential data of the key value data decoded by the entropy decoder 1120 are input into the inverse DPCM processor 130, and then the inverse DPCM processor 1130 performs an inverse circular DPCM operation or an inverse predictive-circular DPCM operation on the input differential data depending on the type of DPCM performed. The inverse circular DPCM operation and the predictive-circular DPCM operation are the same as the operation of the aforementioned inverse DPCM operator except that they are performed on the key value data of each of the x, y, and z components, separately.

The inverse DPCM processor 1130 outputs quantized key value data $\tilde{P}_{i,j}$ generated by an inverse DPCM operation to the inverse quantizer 1140, and then the inverse quantizer 1140 inversely quantizes $\tilde{P}_{i,j}$ using the quantization bits nKeyValueQBits input from the key value header decoder 1110 in step S1370. When n represents the number of key value data input from the key value header decoder 110, the inverse quantization performed in the inverse quantizer 1140 can be expressed by the following equation.

$$\hat{P}_{i,j} = \frac{\tilde{P}_{i,j}}{(2^{nKeyValueQBits} - 1)} (i = nStartIndex, ..., n; j = x, y, z) \quad (18)$$

The inverse quantizer 1140 generates normalized data by performing inverse quantization on the key value data of each of the x, y, and z components and outputs the normalized key value data of each of the x, y, and z components to the inverse normalizer 1150.

The inverse normalizer 1150 inverse normalizes the normalized key value data input from the inverse quantizer 1140 using the information input from the floating-point number decoder 1160.

Figure 14C:
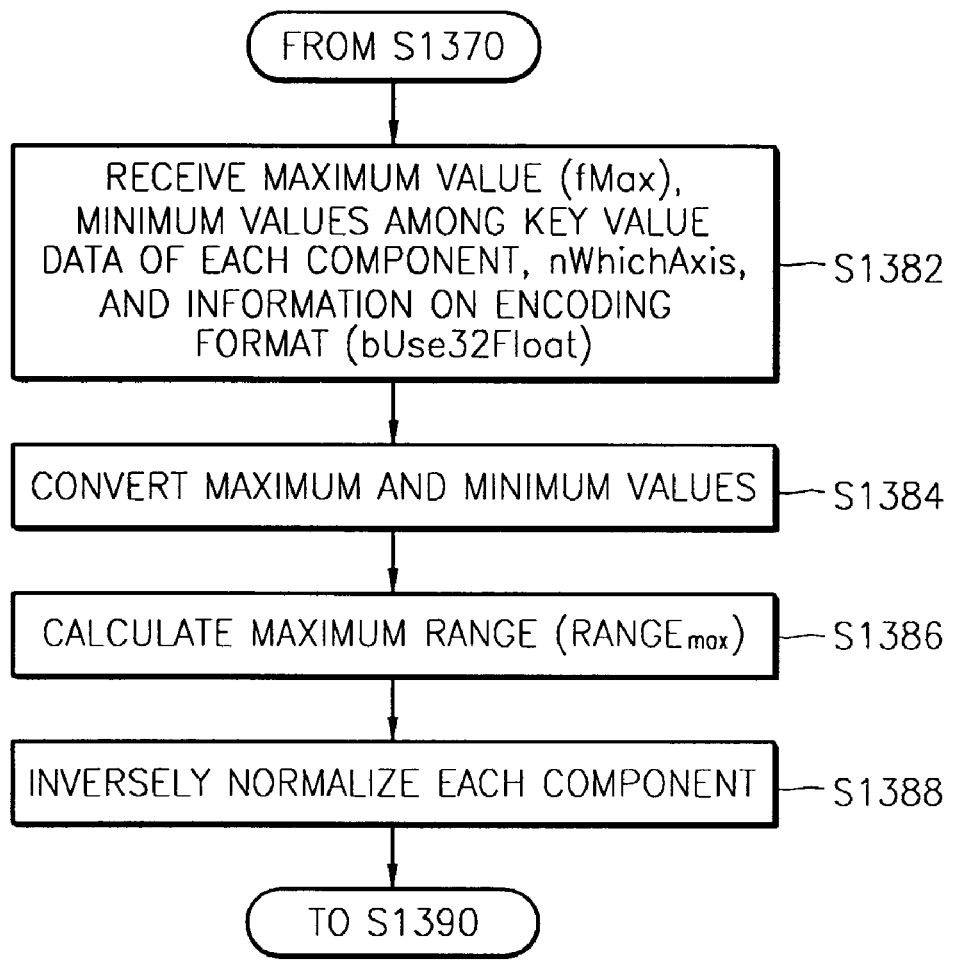
FIG. 14C is a detailed flowchart of step S1380 shown in FIG. 13B.

Hereinafter, the inverse normalization of the normalized key value data of each of the x, y, and z components will be described with reference to FIG. 14C.

The floating-point number decoder 1160 receives the information bUse32Float and checks if bUse32Float is true. If bUse32Float is true, the floating-point number decoder receives the maximum value fMax used for inverse normalization, the minimum values fMin_X, fMin_Y, and fMin_Z among the key value data of each of the x, y, and z components with IEEE Standard 754 floating-point number format, if not, the floating-point number decoder receives the maximum value fMax used for inverse normalization, the minimum values fMin_X, fMin_Y, and fMin_Z among the key value data of each of the x, y, and z components, and receives the information nWhichAxis on which component the maximum value fMax belongs to in step S1382.

The floating-point number decoder 1160 converts fMax, fMin_X, fMin_Y, and fMin_Z which are represented in the decimal system into binary numbers following Equation (9) and outputs the converted values to the inverse normalizer 1150 in step S1384.

The inverse normalizer 1150 checks based on bUse32Float if fMax, fMin_X, fMin_Y, and fMin_Z have been encoded into 32 bits. If fMax, fMin_X, fMin_Y, and fMin_Z have been encoded into 32 bits, the inverse normalizer 1150 determines fMax as $Range_{max}$ and if not, the inverse normalizer and calculates the maximum value $Range_{max}$ in the maximum range following Equation (15) in step S1386.

If $Range_{max}$ is determined, the inverse normalizer 1150 inversely normalizes the key value data of each of the x, y, and z components based on $Range_{max}$, following Equation (16) in step S1388.

Examples of program codes, by which the operation of the apparatus for decoding data according to the third embodiment of the present invention are realized, are shown in FIGS. 24 through 27.

FIG. 24 shows an example of C++ program codes, into which an inverse circular DPCM operation is realized, and FIG. 25 shows an example of C++ program codes, by which an inverse predictive-circular DPCM operation is realized.

The inverse circular DPCM operation and the inverse predictive-circular DPCM operation all include an inverse circular quantization routine for selecting a certain value in a quantization range.

Examples of C++ program codes, by which the operation of an entropy decoder (adaptive arithmetic decoder) is realized, are shown in FIGS. 26 through 31. Here, qf_decode( ) represents a function for reading one bit from a bitstream.

The present invention can be realized as computer-readable codes written on a computer-readable recording medium. Here, the computer-readable recording medium includes any kind of recording medium which can be read by a computer system. For example, the computer-readable recording medium may be a ROM, a RAM, a CD-ROM, a magnetic tape, a floppy disk, an optical data storage, and carrier wave (transmission through the Internet). The computer-readable recording medium can be transmitted to computer systems connected via a network, and a computer can read the recording medium in a decentralized way.

As described above, the DPCM operator according to the present invention and its operation can considerably reduce the size of differential data by performing a predictive DPCM operation and a circular quantization operation as well as a conventional DPCM operation. In addition, it is possible to dramatically enhance the efficiency of encoding data by encoding data using the DPCM operation according to the present invention.

In addition, it is possible to enhance the efficiency of encoding data by normalizing data having a plurality of components based on one of the x, y, and z components using the normalizer of the present invention so as to decrease the size of the data.

Moreover, it is possible to encode and decode key value data of a position interpolator with a higher compression rate by performing a circular quantization operation after performing a DPCM operation and a predictive DPCM operation and thus reducing the range of differential data to be encoded.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for encoding data having a plurality of components representing a position of an object in a multidimensional space, the apparatus comprising:
   a normalizer which, for each of the plurality of components, determines a maximum value and a minimum value among data of the component and calculates a data range among the data of the component by calculating a difference between the determined maximum and minimum values for the component, compares the calculated data ranges of the plurality of components to determine a maximum range among the calculated data ranges of the components, and normalizes the data of each of the plurality of components based on the determined maximum range among the calculated data ranges of the components;
   a quantizer which quantizes the normalized data with predetermined quantization bits;
   a differential pulse code modulation (DPCM) operator which performs a DPCM operation on the quantized data and then outputs differential data; and
   an entropy encoder which entropy-encodes the differential data and outputs a bitstream, into which the differential data are encoded.

2. An apparatus for decoding data, which decodes a bitstream into which data having a plurality of components representing a position of an object in a multidimensional space are encoded, the apparatus comprising:
   an entropy decoder which entropy-decodes a bitstream input thereinto and outputs differential data;
   an inverse differential pulse code modulation (DPCM) operator which performs an inverse DPCM operation on the differential data and outputs quantized data;
   an inverse quantizer which inversely quantizes the quantized data and outputs normalized data; and
   an inverse normalizer which receives minimum values among data of each component and a maximum value of a component used for normalization, obtains a maximum range of the normalized data based on the maximum value and the minimum value of the component corresponding to the maximum value, and inversely normalizes the normalized data of each of the components based on the maximum range.

3. The apparatus of claim 2, wherein the inverse normalizer inversely normalizes the normalized data input thereinto using the maximum range and minimum values of the component to which the normalized data belong.

4. An apparatus for decoding data, which decodes a bitstream into which data having a plurality of components are encoded, the apparatus comprising:
   an entropy decoder which entropy-decodes a bitstream input thereinto and outputs differential data;
   an inverse differential pulse code modulation (DPCM) operator which performs an inverse DPCM operation on the differential data and outputs quantized data;
   an inverse quantizer which inversely quantizes the quantized data and outputs normalized data; and
   an inverse normalizer which receives minimum values among data of each component and a maximum value of a component having the maximum range, obtains a maximum range of the normalized data, and inversely normalizes the normalized data based on the maximum range, wherein the inverse normalizer inversely normalizes the normalized data input thereinto by multiplying the normalized data by the maximum range and adding the minimum value of the component, to which the normalized data belong, to the results of the multiplication.

5. An apparatus for encoding and decoding data which encodes and decodes key value data of a position interpolator representing the position of an object using x, y, and z components to represent the position of the object in a three-dimensional space, the apparatus comprising:
   an encoder which comprises:
      a quantizer which quantizes key value data input thereinto with predetermined quantization bits;
      a differential pulse code modulation (DPCM) processor which selects an output of a circular DPCM operation or a predictive-circular DPCM operation on the quantized key value data depending on the value of the output of the DPCM operations performed on the quantized key value data and outputs differential data; and
      an entropy encoder which entropy-encodes the differential data and outputs a bitstream, into which the key value data are encoded; and
   a decoder which comprises:
      an entropy decoder which entropy-decodes a bitstream, into which key value data are encoded, and outputs differential data;
      an inverse circular DPCM processor which performs an inverse circular DPCM operation on the differential data and outputs quantized key value data;
      an inverse quantizer which inversely quantizes the quantized key value data and retrieves the key value data; and
      a key value header decoder which decodes information required for decoding from the bitstream and provides the information to the entropy decoder, the inverse OPOM processor, and the inverse quantizer.

6. A method for encoding data having a plurality of components representing a position of an object in a multidimensional space, the method comprising:
   (a) for each of the plurality of components, determining a maximum value and a minimum value among data of the component and calculating a data range among the data of the component by calculating a difference between the determined maximum and minimum values for the component, comparing the calculated data ranges of the plurality of components to determine a maximum range among the calculated data ranges of the components, and normalizing the data of each of the plurality of components based on the determined maximum range among the calculated data ranges of the components;
   (b) quantizing the normalized data with predetermined quantization bits;
   (c) generating differential data by performing a differential pulse code modulation (DPCM) operation on the quantized data; and
   (d) generating a bitstream, into which data are encoded, by entropy-encoding the differential data.

7. A method for decoding data, which decodes a bitstream into which data having a plurality of components representing a position of an object in a multidimensional space are encoded, the method comprising:

(a) generating differential data by entropy-decoding an input bitstream;

(b) generating quantized data by performing an inverse differential pulse code modulation (DPCM) operation on the differential data;

(c) generating normalized data by inversely quantizing the quantized data; and (d) decoding from the bitstream minimum values among data of each component and a maximum value of a component used for normalization, obtaining a maximum range of the normalized data based on the maximum value and the minimum value of the component corresponding to the maximum value, and inversely normalizing the normalized data of each of the components based on the maximum range.

8. The method of claim 7, wherein in step (d), the normalized data are inversely normalized using the maximum range and a minimum value of the component to which the normalized data belong.

9. A method for decoding data, which decodes a bitstream into which data having a plurality of components representing a position of an object in a multidimensional space are encoded, the method comprising:

(a) generating differential data by entropy-decoding an input bitstream;

(b) generating quantized data by performing an inverse differential pulse code modulation (DPCM) operation on the differential data;

(c) generating normalized data by inversely quantizing the quantized data; and (d) decoding from the bitstream minimum values among data of each component and a maximum value of a component having the maximum range, obtaining a maximum range of the normalized data, and inversely normalizing the normalized data of each of the components based on the maximum range, wherein the step of inversely normalizing the normalized data comprises multiplying the normalized data by the maximum range and adding the minimum value of the component, to which the normalized data belong, to the results of the multiplication.

* * * * *